United States Patent
Hsiung et al.

(10) Patent No.: US 11,495,681 B2
(45) Date of Patent: Nov. 8, 2022

(54) SEMICONDUCTOR DEVICE AND MANUFACTURING METHOD THEREOF

(71) Applicant: UNITED MICROELECTRONICS CORP., Hsin-Chu (TW)

(72) Inventors: Chang-Po Hsiung, Hsinchu (TW); Ching-Chung Yang, Hsinchu (TW); Shan-Shi Huang, Hsinchu (TW); Shin-Hung Li, Nantou County (TW); Nien-Chung Li, Hsinchu (TW); Wen-Fang Lee, Hsinchu (TW); Chiu-Te Lee, Hsinchu County (TW); Chih-Kai Hsu, Tainan (TW); Chun-Ya Chiu, Tainan (TW); Chin-Hung Chen, Tainan (TW); Chia-Jung Hsu, Tainan (TW); Ssu-I Fu, Kaohsiung (TW); Yu-Hsiang Lin, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 133 days.

(21) Appl. No.: 17/067,775

(22) Filed: Oct. 12, 2020

(65) Prior Publication Data
US 2022/0085210 A1 Mar. 17, 2022

(30) Foreign Application Priority Data
Sep. 15, 2020 (CN) .......................... 202010965229.4

(51) Int. Cl.
*H01L 29/78* (2006.01)
*H01L 29/10* (2006.01)
(Continued)

(52) U.S. Cl.
CPC .... *H01L 29/7816* (2013.01); *H01L 21/02236* (2013.01); *H01L 21/28114* (2013.01);
(Continued)

(58) Field of Classification Search
CPC ......... H01L 29/66704; H01L 29/66734; H01L 29/7813; H01L 29/7825; H01L 29/7816;
(Continued)

(56) References Cited

U.S. PATENT DOCUMENTS 6,847,081 B2  1/2005  Letavic
7,898,026 B2 *  3/2011  Hsieh ................ H01L 29/66659
                                              257/E29.256

(Continued)

*Primary Examiner* — Monica D Harrison
*Assistant Examiner* — Andre C Stevenson
(74) *Attorney, Agent, or Firm* — Winston Hsu

(57) ABSTRACT

A semiconductor device includes a semiconductor substrate, a recess, a first gate oxide layer, and a gate structure. The semiconductor substrate includes a first region and a second region adjacent to the first region. The recess is disposed in the first region of the semiconductor substrate, and an edge of the recess is located at an interface between the first region and the second region. At least a part of the first gate oxide layer is disposed in the recess. The first gate oxide layer includes a hump portion disposed adjacent to the edge of the recess, and a height of the hump portion is less than a depth of the recess. The gate structure is disposed on the first region and the second region of the semiconductor substrate, and the gate structure overlaps the hump portion of the first gate oxide layer in a vertical direction.

16 Claims, 20 Drawing Sheets

(51) Int. Cl.
| | |
|---|---|
| *H01L 29/423* | (2006.01) |
| *H01L 21/02* | (2006.01) |
| *H01L 29/66* | (2006.01) |
| *H01L 21/311* | (2006.01) |
| *H01L 21/28* | (2006.01) |

(52) U.S. Cl.
CPC ... *H01L 21/31111* (2013.01); *H01L 21/31144* (2013.01); *H01L 29/1095* (2013.01); *H01L 29/42376* (2013.01); *H01L 29/66492* (2013.01); *H01L 29/66545* (2013.01); *H01L 29/66681* (2013.01); *H01L 29/7835* (2013.01)

(58) Field of Classification Search
CPC ......... H01L 21/02236; H01L 21/28114; H01L 21/31111; H01L 21/31144; H01L 29/1095; H01L 29/42376; H01L 29/66492; H01L 29/66545; H01L 29/66681; H01L 29/7835
See application file for complete search history.

(56) References Cited

U.S. PATENT DOCUMENTS

| | | |
|---|---|---|
| 9,716,139 B2 | 7/2017 | Chen |
| 10,553,583 B2 | 2/2020 | Chen |
| 2006/0006462 A1* | 1/2006 | Chang ................. H01L 29/7391 |
| | | 257/E21.549 |
| 2014/0103440 A1* | 4/2014 | Chatterjee ......... H01L 21/28123 |
| | | 438/296 |
| 2016/0336417 A1 | 11/2016 | Hsiao |

* cited by examiner

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, and more particularly, to a semiconductor device including a gate oxide layer disposed in a recess and a manufacturing method thereof.

2. Description of the Prior Art

Double-diffused MOS (DMOS) transistor devices have drawn much attention in power devices having high voltage capability. The conventional DMOS transistor devices are categorized into vertical double-diffused MOS (VDMOS) transistor device and lateral double-diffused MOS (LDMOS) transistor device. Having advantage of higher operational bandwidth, higher operational efficiency, and convenience to be integrated with other integrated circuit due to its planar structure, LDMOS transistor devices are prevalently used in high operation voltage environment such as CPU power supply, power management system, AC/DC converter, and high-power or high frequency (HF) band power amplifier. The essential feature of LDMOS transistor device is a lateral-diffused drift region with low doping concentration and large area. The drift region is used to alleviate the high voltage between the drain and the source, and therefore LDMOS transistor device can have higher breakdown voltage. In the extended-drain MOS (EDMOS) transistor, it is common to provide a thicker gate oxide layer on the side adjacent to the drain electrode and a thinner gate oxide layer on the side adjacent to the source electrode, and the operation with relatively higher voltage and the operation with relatively lower voltage in the same transistor including the gate oxide layers of different thicknesses may be realized accordingly. However, the gate oxide layers of different thicknesses may easily cause excessive surface fluctuations, which affect the shape of the gate electrode formed on the gate oxide layer and related manufacturing processes, and have negative an influence on the manufacturing yield and the electrical performance of the product.

SUMMARY OF THE INVENTION

A semiconductor device and a manufacturing method thereof are provided in the present invention. A gate oxide layer is disposed in a recess for increasing a thickness of a part of the gate oxide layer and reducing the negative influence of the gate oxide layer on a gate electrode and a method of forming the gate electrode.

According to an embodiment of the present invention, a semiconductor device is provided. The semiconductor device includes a semiconductor substrate, a recess, a first gate oxide layer, and a gate structure. The semiconductor substrate includes a first region and a second region adjacent to the first region. The recess is disposed in the first region of the semiconductor substrate, and an edge of the recess is located at an interface between the first region and the second region. At least a part of the first gate oxide layer is disposed in the recess, the first gate oxide layer includes a hump portion disposed adjacent to the edge of the recess, and a height of the hump portion is less than a depth of the recess. The gate structure is disposed on the first region and the second region of the semiconductor substrate, and the gate structure overlaps the hump portion of the first gate oxide layer in a vertical direction.

According to an embodiment of the present invention, a manufacturing method of a semiconductor device is provided. The manufacturing method includes the following steps. A semiconductor substrate is provided. The semiconductor substrate includes a first region and a second region adjacent to the first region. A recess is formed in the first region of the semiconductor substrate, and an edge of the recess is located at an interface between the first region and the second region. A first gate oxide layer is formed on the semiconductor substrate, and at least a part of the first gate oxide layer is disposed in the recess. The first gate oxide layer includes a hump portion disposed adjacent to the edge of the recess, and a height of the hump portion is less than a depth of the recess. A gate structure is formed on the first region and the second region of the semiconductor substrate, and the gate structure overlaps the hump portion of the first gate oxide layer in a vertical direction.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 3-10 are schematic drawings illustrating a manufacturing method of the semiconductor device according to the first embodiment of the present invention, wherein FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, and FIG. 10 is a schematic drawing in a step subsequent to FIG. 9.

FIGS. 12-18 are schematic drawings illustrating a manufacturing method of the semiconductor device according to the second embodiment of the present invention, wherein FIG. 13 is a schematic drawing in a step subsequent to FIG. 12, FIG. 14 is a schematic drawing in a step subsequent to FIG. 13, FIG. 15 is a schematic drawing in a step subsequent to FIG. 14, FIG. 16 is a schematic drawing in a step subsequent to FIG. 15, FIG. 17 is a schematic drawing in a step subsequent to FIG. 16, and FIG. 18 is a schematic drawing in a step subsequent to FIG. 17.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "etch" is used herein to describe the process of patterning a material layer so that at least a portion of the material layer after etching is retained. When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
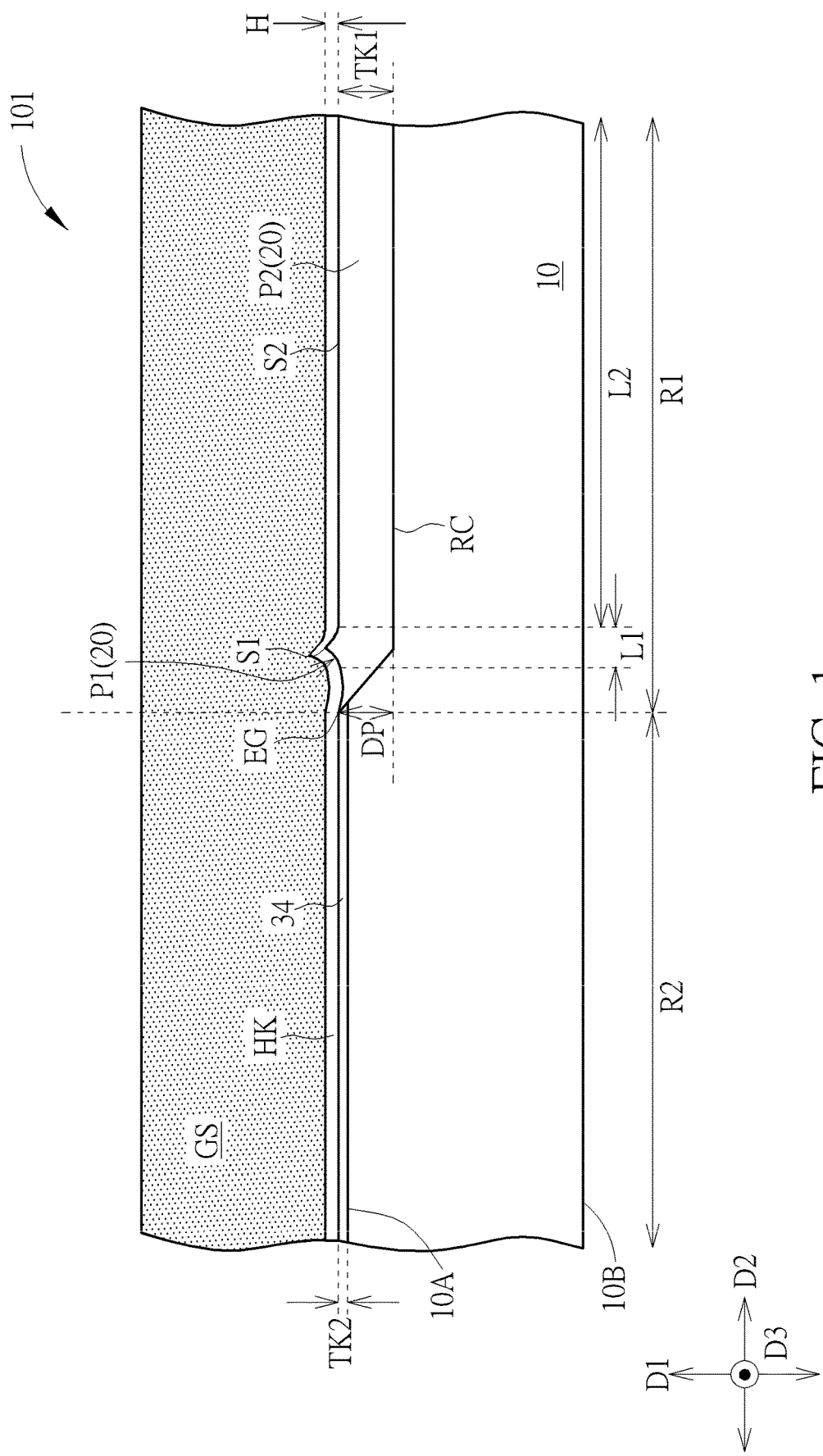
FIG. 1 is a schematic drawing illustrating a semiconductor device according to a first embodiment of the present invention.

Please refer to FIG. 1. FIG. 1 is a schematic drawing illustrating a semiconductor device according to a first embodiment of the present invention. As shown in FIG. 1, a semiconductor device 101 includes a semiconductor substrate 10, a recess RC, a first gate oxide layer 20, and a gate structure GS. The semiconductor substrate 10 includes a first region R1 and a second region R2 adjacent to the first region R1. The recess RC is disposed in the first region R1 of the semiconductor substrate 10, and an edge EG of the recess RC is located at an interface between the first region R1 and the second region R2. At least a part of the first gate oxide layer 20 is disposed in the recess RC, the first gate oxide layer 20 includes a hump portion P1 disposed adjacent to the edge EG of the recess RC, and a height H of the hump portion P1 is less than a depth DP of the recess RC. The gate structure GS is disposed on the first region R1 and the second region R2 of the semiconductor substrate 10, and the gate structure GS overlaps the hump portion P1 of the first gate oxide layer 20 in a vertical direction (such as a first direction D1 shown in FIG. 1).

Specifically, in some embodiments, the first region R1 and the second region R2 may be directly connected with each other, and the location of the interface between the first region R1 and the second region R2 may be defined by the edge EG of the recess RC, but not limited thereto. Additionally, in some embodiments, the first direction D1 described above may be regarded as a thickness direction of the semiconductor substrate 10, and the semiconductor substrate 10 may have a top surface 10A and a bottom surface 10B opposite to the top surface 10A in the first direction D1. The recess RC, the first gate oxide layer 20, and the gate structure GS may be disposed at a side of the top surface 10A, but not limited thereto. In addition, horizontal directions (such as a second direction D2 and a third direction D3 shown in FIG. 1) substantially orthogonal to the first direction D1 may be substantially parallel with the top surface 10A and/or the bottom surface 10B of the semiconductor substrate 10, but not limited thereto. Additionally, in this description, a distance between the bottom surface 10B of the semiconductor substrate 10 and a relatively higher location and/or a relatively higher part in the first direction D1 is greater than a distance between the bottom surface 10B of the semiconductor substrate 10 and a relatively lower location and/or a relatively lower part in the first direction D1. The bottom of each part may be closer to the bottom surface 10B of the semiconductor substrate 10 in the first direction D1 than the top of this part. Another part disposed above a specific part may be regarded as being relatively far from the bottom surface 10B of the semiconductor substrate 10 in the first direction D1, and another part disposed under a specific part may be regarded as being relatively closer to the bottom surface 10B of the semiconductor substrate 10 in the first direction D1.

In some embodiments, the first gate oxide layer 20 may further include a main portion P2 connected with the hump portion P1, and the gate structure GS may further overlap the main portion P2 in the first direction D1. A top surface S2 of the main portion P2 may be lower than a top surface S1 of the hump portion P1 in the first direction D1, and a thickness TK1 of the main portion P2 in the first direction D1 may be greater than the height H of the hump portion P1. In some embodiments, the top surface S2 of the main portion P2 of the first gate oxide layer 20 may be the topmost surface of the main portion P2 in the first direction D1, the top surface S1 of the hump portion P1 of the first gate oxide layer 20 may be the topmost surface of the hump portion P1 in the first direction D1, and the height H of the hump portion P1 may be regarded as a height difference between the top surface S1 and the top surface S2 in the first direction D1 and/or a distance between the top surface S1 and the top surface S2 in the first direction D1. Additionally, the depth DP may be regarded as a height difference between a bottom surface BS of the recess RC and the top surface 10A of the semiconductor substrate 10 in the first direction D1 and/or a distance between the bottom surface BS of the recess RC and the top surface 10A of the semiconductor substrate 10 in the first direction D1. In some embodiments, the depth DP may be regarded as a height difference and/or a distance between the bottom surface BS of the recess RC and the edge EG of the recess RC in the first direction D1. In other words, when the bottom surface BS of the recess RC is the bottommost surface of the recess RC in the first direction D1, the depth DP of the recess RC may be equal to the maximum depth of the recess RC.

In some embodiments, the thickness TK1 of the main portion P2 of the first gat oxide layer 20 may be substantially equal to the depth DP of the recess RC preferably for improving the negative influence of the extremely thick main portion P2 on the gate structure GS and the manufacturing method of the gate structure GS. For example, considering the influence of process variation, the thickness TK1 of the main portion P2 may range from 90% of the depth DP of the recess RC to 110% of the depth DP of the recess RC (i.e. being greater than or equal to 0.9 times the depth DP of the recess RC and less than or equal to 1.1 times the depth DP of the recess RC). In some embodiments, the thickness TK1 of the main portion P2 may be greater than or equal to 0.95 times the depth DP of the recess RC and less than or equal to 1.05 times the depth DP o the recess RC. Additionally, in some embodiments, the height H of the hump portion P1 may be less than or equal to 15% of the depth DP of the recess RC for improving the negative influence of the hump portion P1 on the gate structure GS and the manufacturing method of the gate structure GS, but not limited thereto. In some embodiments, the height H of the hump portion P1 may be less than or equal to 10% of the depth DP of the recess RC, or the height H of the hump portion P1 may be less than or equal to 5% of the depth DP of the recess RC. In addition, the hump portion P1 may be disposed between the edge EG of the recess RC and at least a part of the main portion P1 in a horizontal direction (such as the second direction D2), and a length L1 of the hump portion P1 in the second direction D2 may be less than a length L2 of the main portion P2 in the second direction D2 for further reducing the negative influence of the hump portion P1 on the gate structure GS and the manufacturing method of the gate structure GS.

In some embodiments, the semiconductor device 101 may further include a second gate oxide layer 34 disposed on the second region R2 of the semiconductor substrate 10. The second gate oxide layer 34 may be thinner than the first gate oxide layer 20, and the gate structure GS may further overlap the second gate oxide layer 34 in the first direction D1. For example, a thickness TK2 of the second gate oxide layer 34 in the first direction D1 may be less than the thickness TK1 of the main portion P2 of the first gate oxide layer 20, but the height difference between the top surface of the second gate oxide layer 34 and the top surface of the first gate oxide layer 20 in the first direction D1 may be reduced because at least most portion of the first gate oxide layer 20 may be disposed in the recess RC. Additionally, in some embodiments, the second gate oxide layer 34 may be directly connected with the first gate oxide layer 20, but not limited thereto. It is worth noting that, in some embodiments, when the gate structure GS, the first gate oxide layer 20, and the second gate oxide layer 34 are a part of the same semiconductor device (such as a transistor, but not limited thereto), operations under different voltages may be applied to the semiconductor device because the semiconductor device may include the gate oxide layers of different thickness covered by the gate structure GS. In addition, the negative influence of the disposition of the first gate oxide layer 20 on the gate structure GS and the manufacturing method of the gate structure GS may be reduced because at least most portion of the relatively thicker first gate oxide layer 20 is disposed in the recess RC.

In some embodiments, the semiconductor device 101 may further include a gate dielectric layer HK disposed between the gate structure GS and the semiconductor substrate 10. A portion of the gate dielectric layer HK may be disposed between the gate structure GS and the first gate oxide layer 20 in the first direction D1 and another portion of the gate dielectric layer HK may be disposed between the gate structure GS and the second gate oxide layer 34 in the first direction. In some embodiments, the gate dielectric layer HK may be formed conformally on the second gate oxide layer 34 and the first gate oxide layer 20, and the gate dielectric layer HK may include a hump portion located corresponding to the hump portion P1 of the first gate oxide layer 20, but not limited thereto.

In some embodiments, the semiconductor substrate 10 may include a silicon substrate, a silicon germanium semiconductor substrate, a silicon-on-insulator (SOI) substrate, or a semiconductor substrate made of other suitable materials. The first gate oxide layer 20 and the second gate oxide layer 34 may include silicon oxide or other suitable oxide materials, respectively. The gate dielectric layer HK may include a high dielectric constant (high-k) dielectric material or other suitable dielectric materials. The high-k materials described above may include hafnium oxide ($HfO_X$), hafnium silicon oxide ($HfSiO_4$), hafnium silicon oxynitride (HfSiON), aluminum oxide ($Al_2O_3$), tantalum oxide ($Ta_2O_5$), zirconium oxide ($ZrO_2$), or other suitable high-k materials. The gate structure GS may include a non-metallic electrically conductive material (such as doped polysilicon) or a metallic electrically conductive material, such as a metal gate structure formed with a work function layer and a low electrical resistivity layer stacked with each other, but not limited thereto. The work function layer described above may include titanium nitride (TiN), titanium carbide (TiC), tantalum nitride (TaN), tantalum carbide (TaC), tungsten carbide (WC), titanium tri-aluminide ($TiAl_3$), aluminum titanium nitride (TiAlN), or other suitable electrically conductive work function materials. The low electrical resistivity layer described above may include tungsten, aluminum, copper, titanium aluminide, titanium, or other suitable low electrical resistivity materials.

Figure 2:
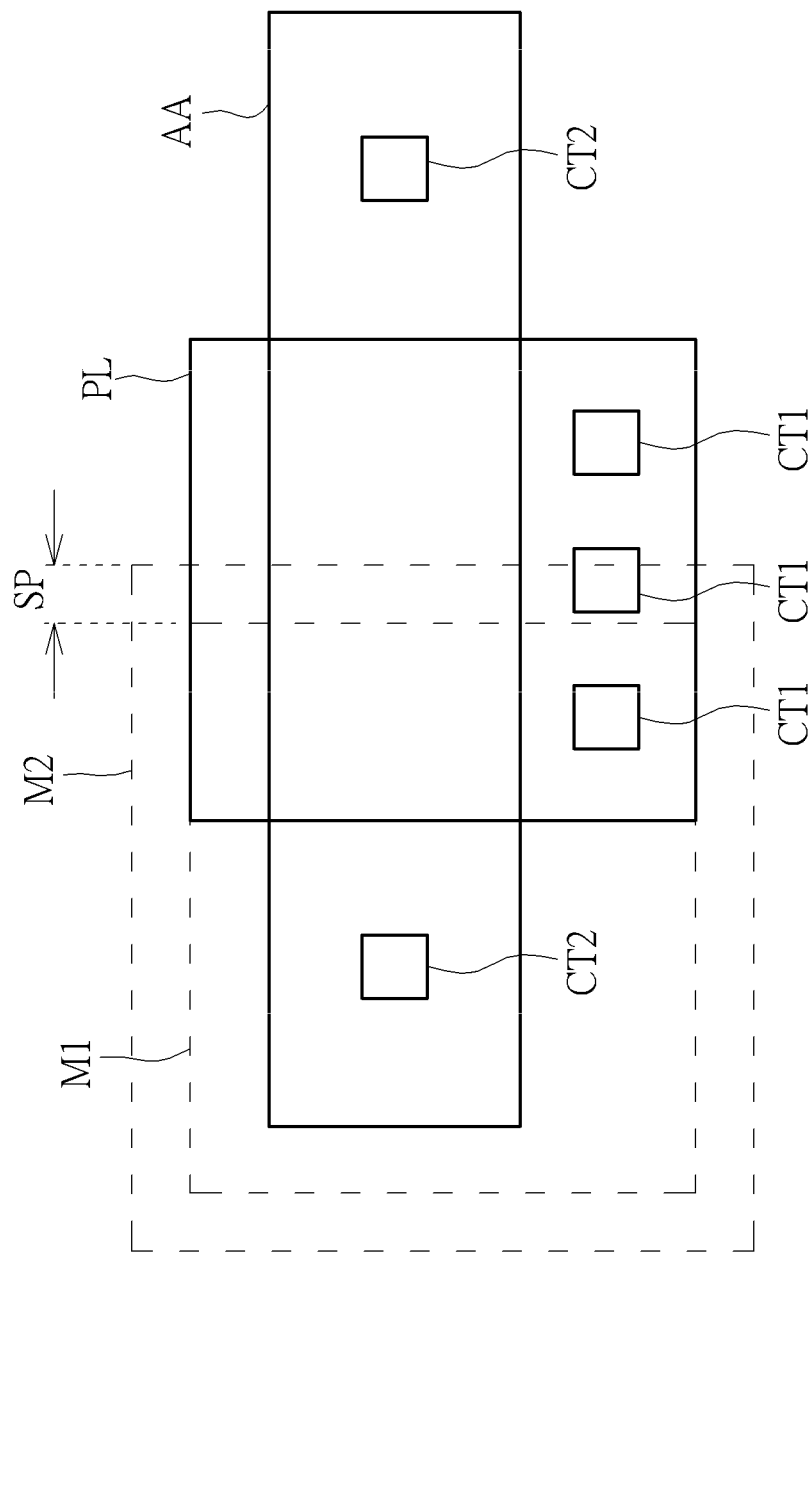
FIG. 2 is a schematic drawing illustrating a layout pattern of the semiconductor device according to the first embodiment of the present invention.

Please refer to FIG. 2 and FIG. 1. FIG. 2 is a schematic drawing illustrating a layout pattern of the semiconductor device according to the first embodiment of the present invention. As shown in FIG. 1 and FIG. 2, in some embodiments, an active pattern AA may be used to define the area of an active region in the semiconductor device, such as an area of an active region including the first region R1 and the second region R2 shown in FIG. 1; a gate pattern PL may be used to define the gate structure GS and/or a dummy gate structure (not shown) corresponding to the gate structure GS; contact patterns CT1 and contact patterns CT2 may be used to define contact structures (not shown) corresponding to the gate structure GS and contact structures corresponding to source/drain regions (not shown) formed in the active region, respectively; and a mask pattern M1 and a mask pattern M2 may be used to define the recess RC and the first gate oxide layer 20 described above, but not limited thereto. In addition, the region within the dotted frame of the mask pattern M1 may be used to define an opening in a mask used in related manufacturing processes, and the region within the dotted frame of the mask pattern M2 may be used to define a shielding part used in related manufacturing processes, but not limited thereto.

Figure 3:
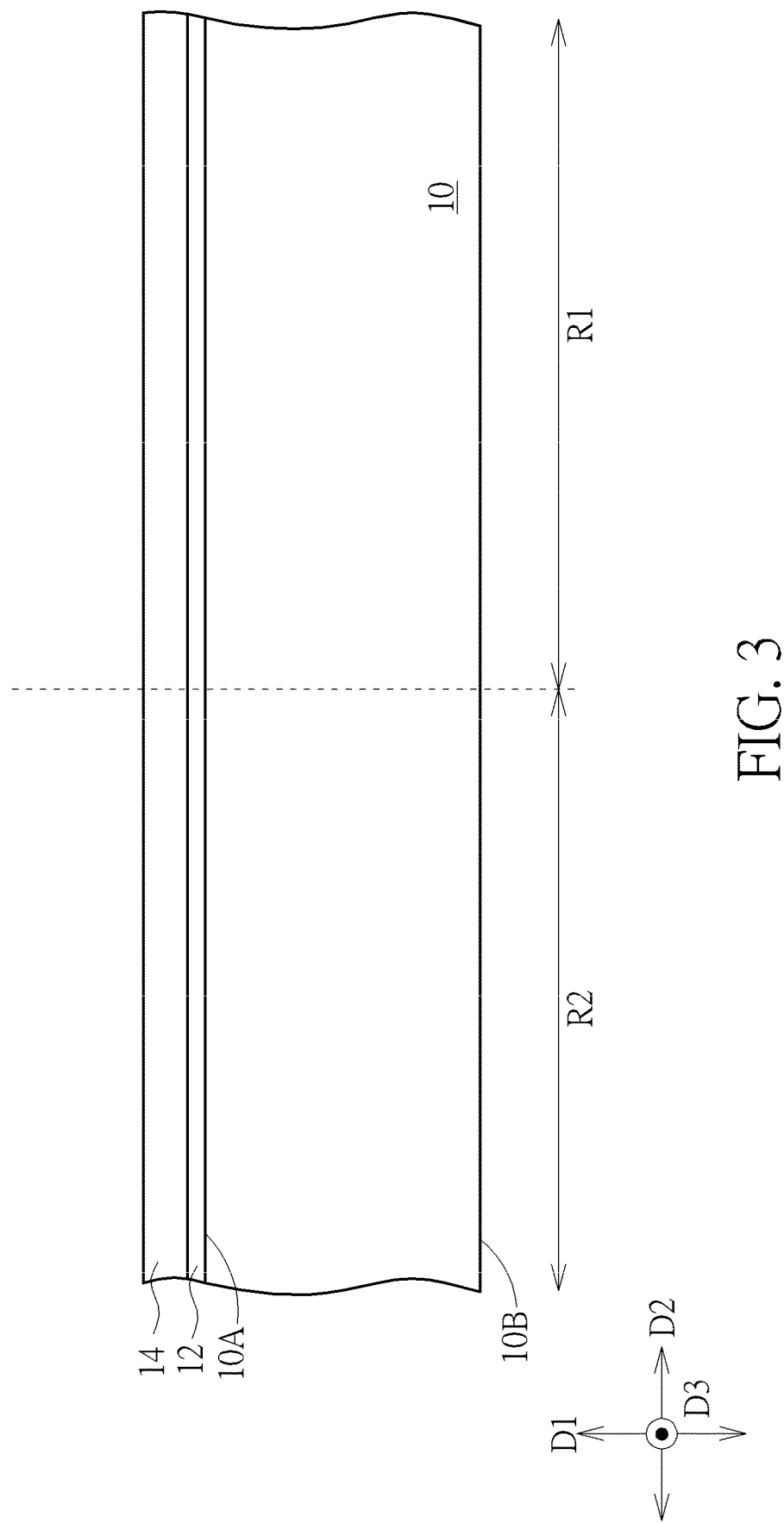
Figure 4:
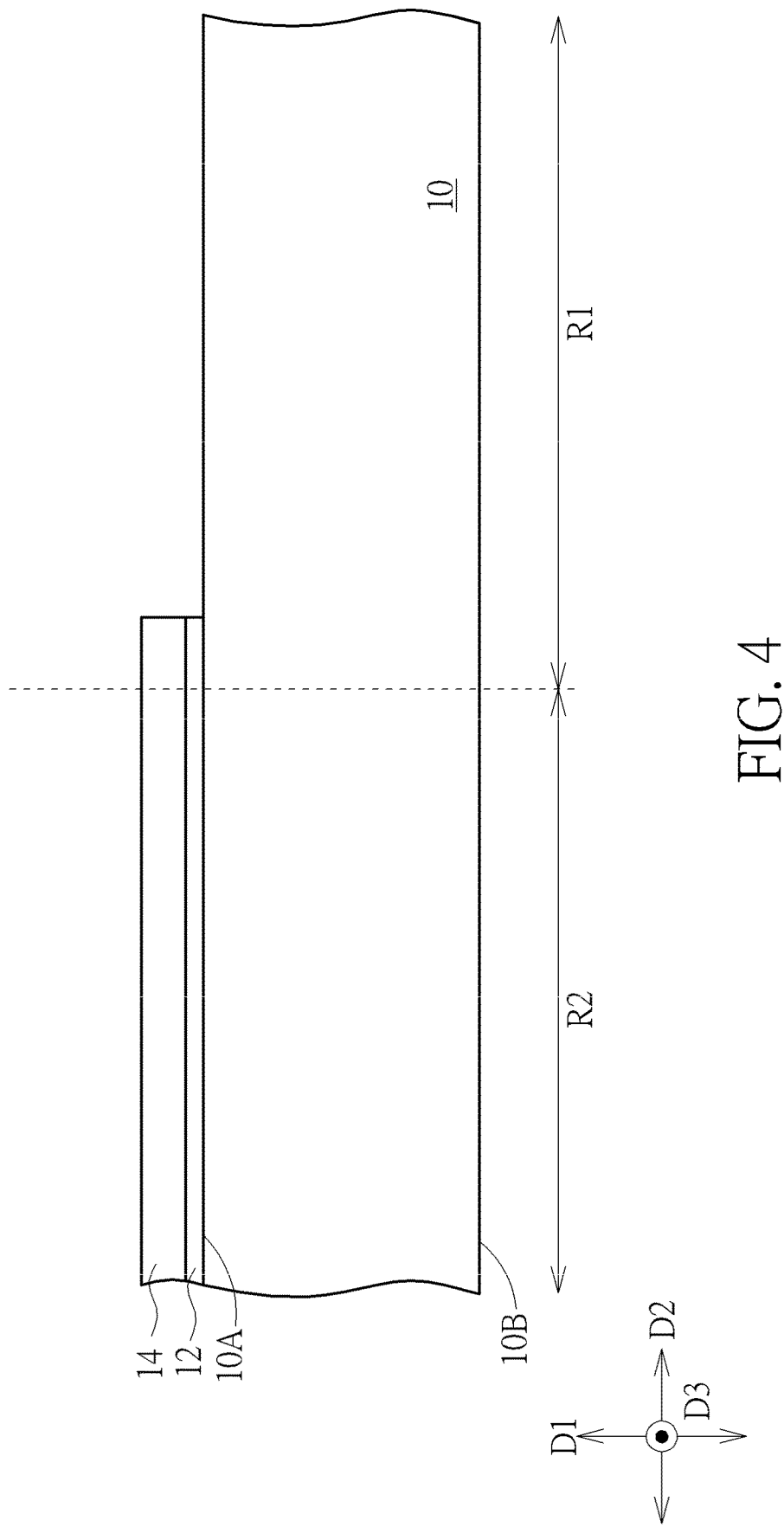
Figure 5:
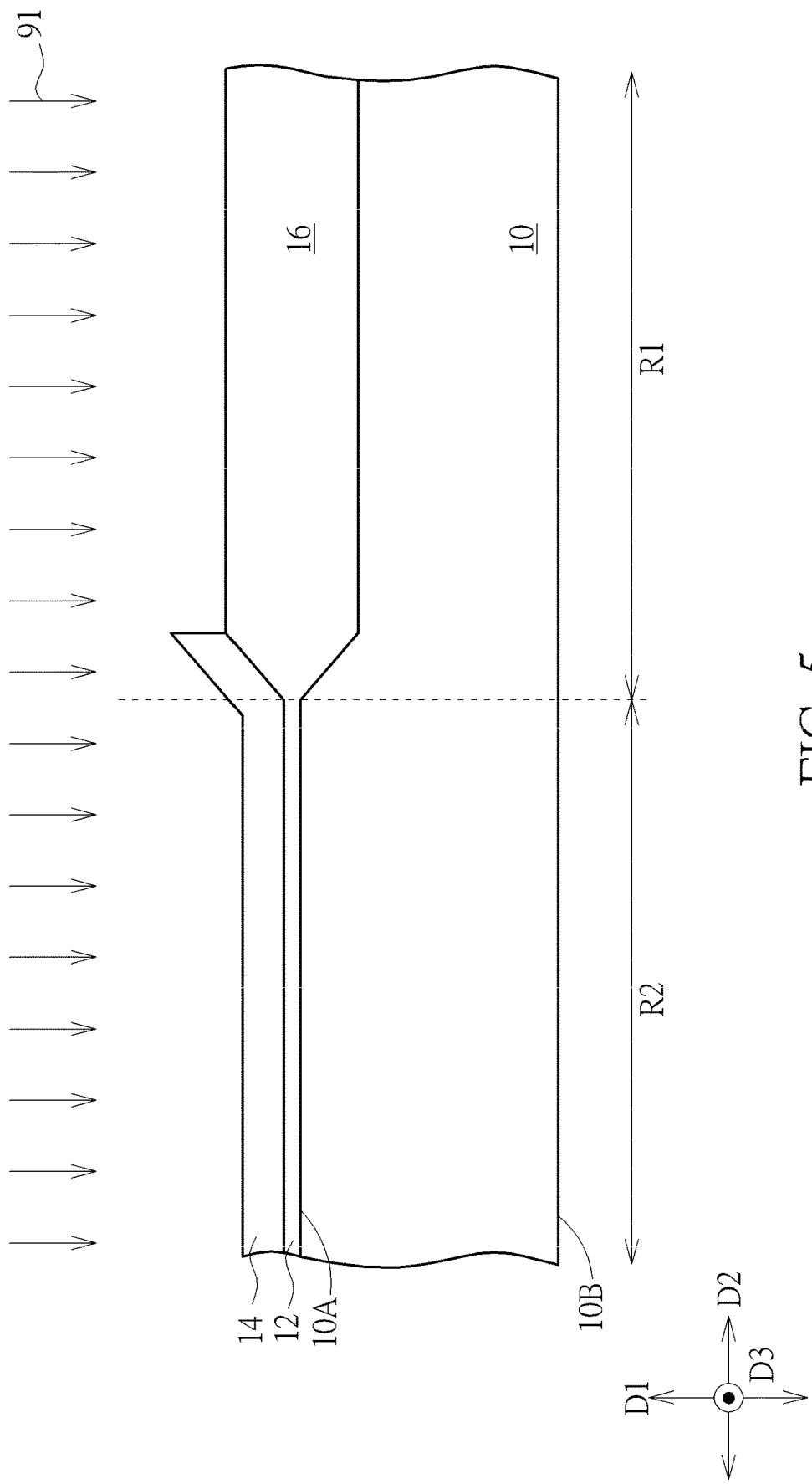
Figure 6:
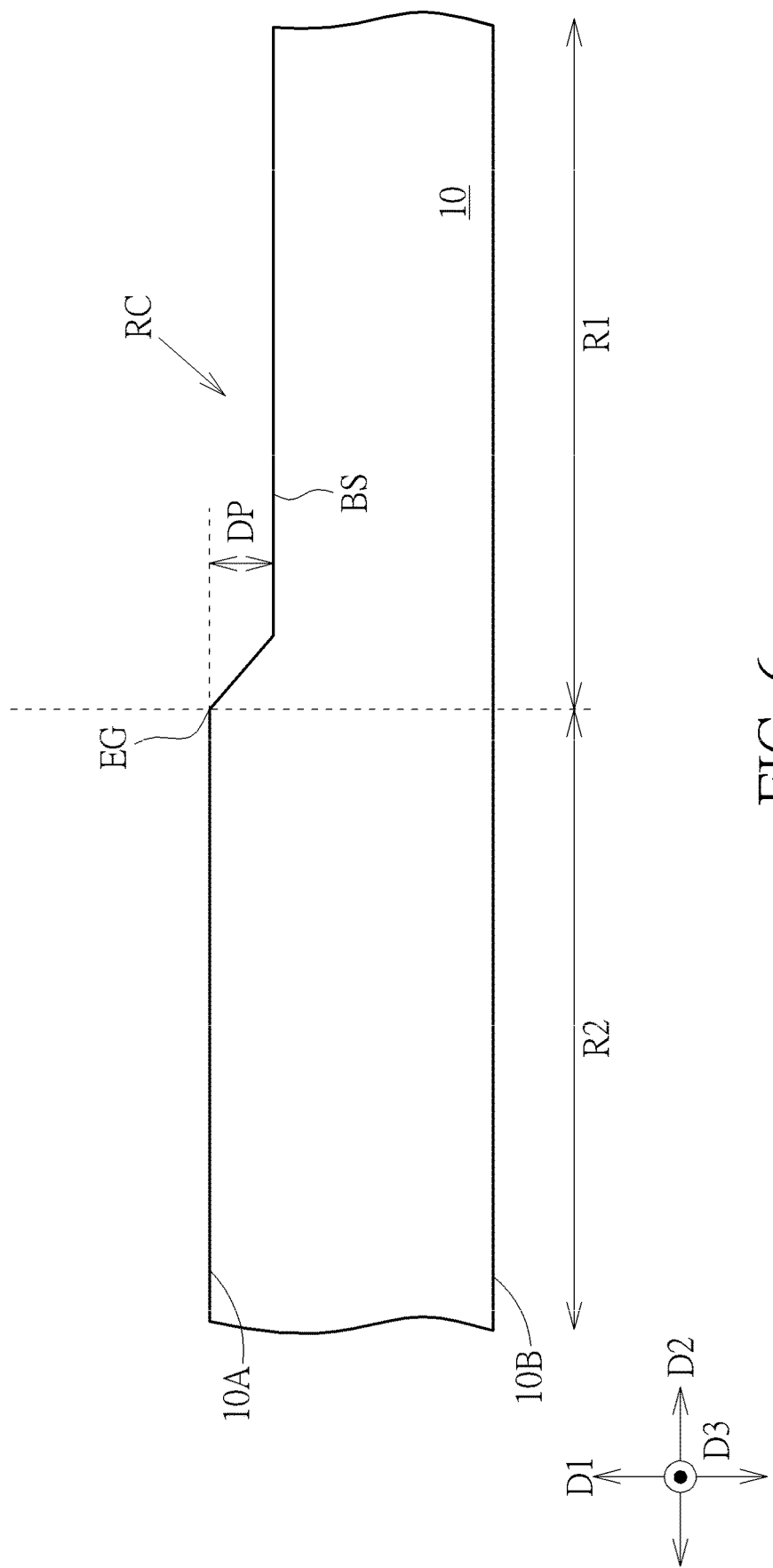
Figure 7:
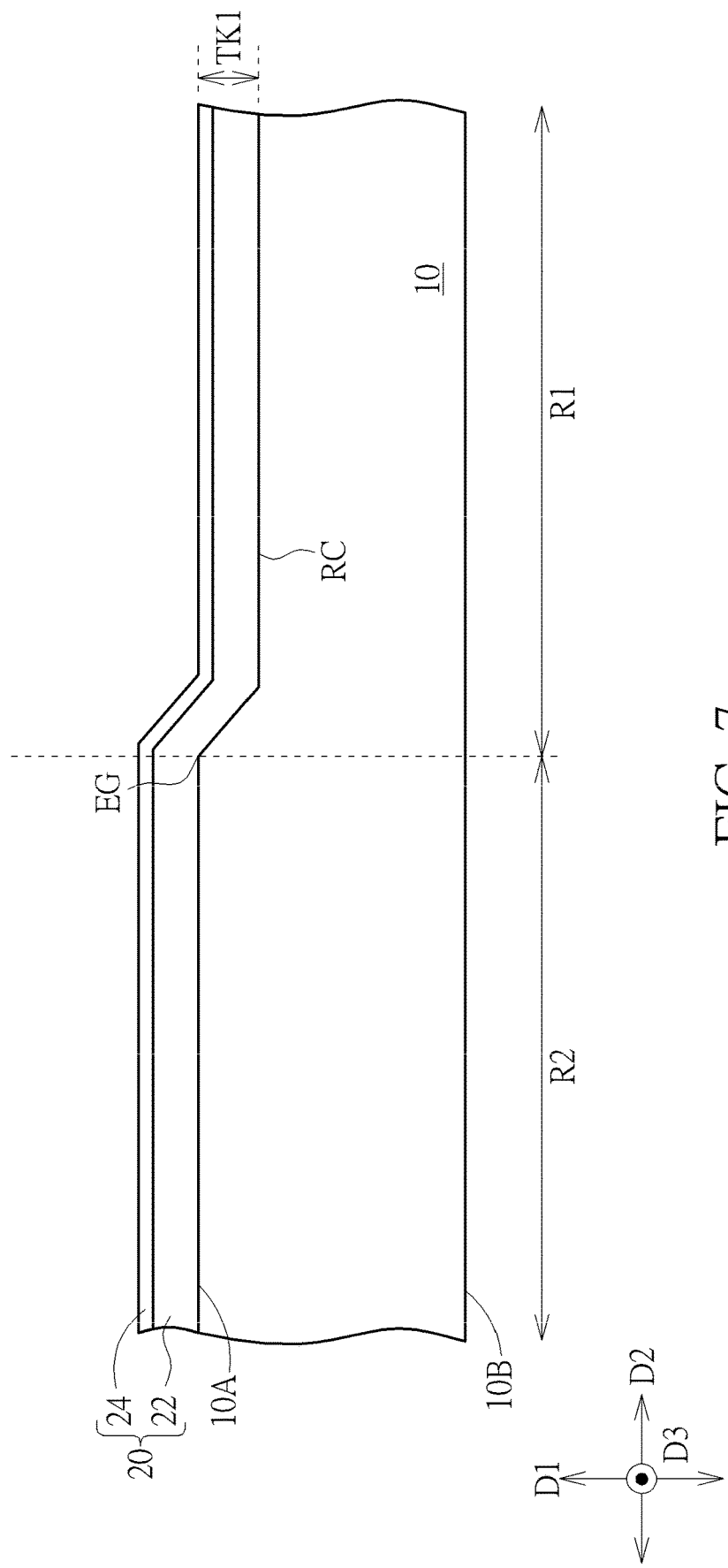
Figure 8:
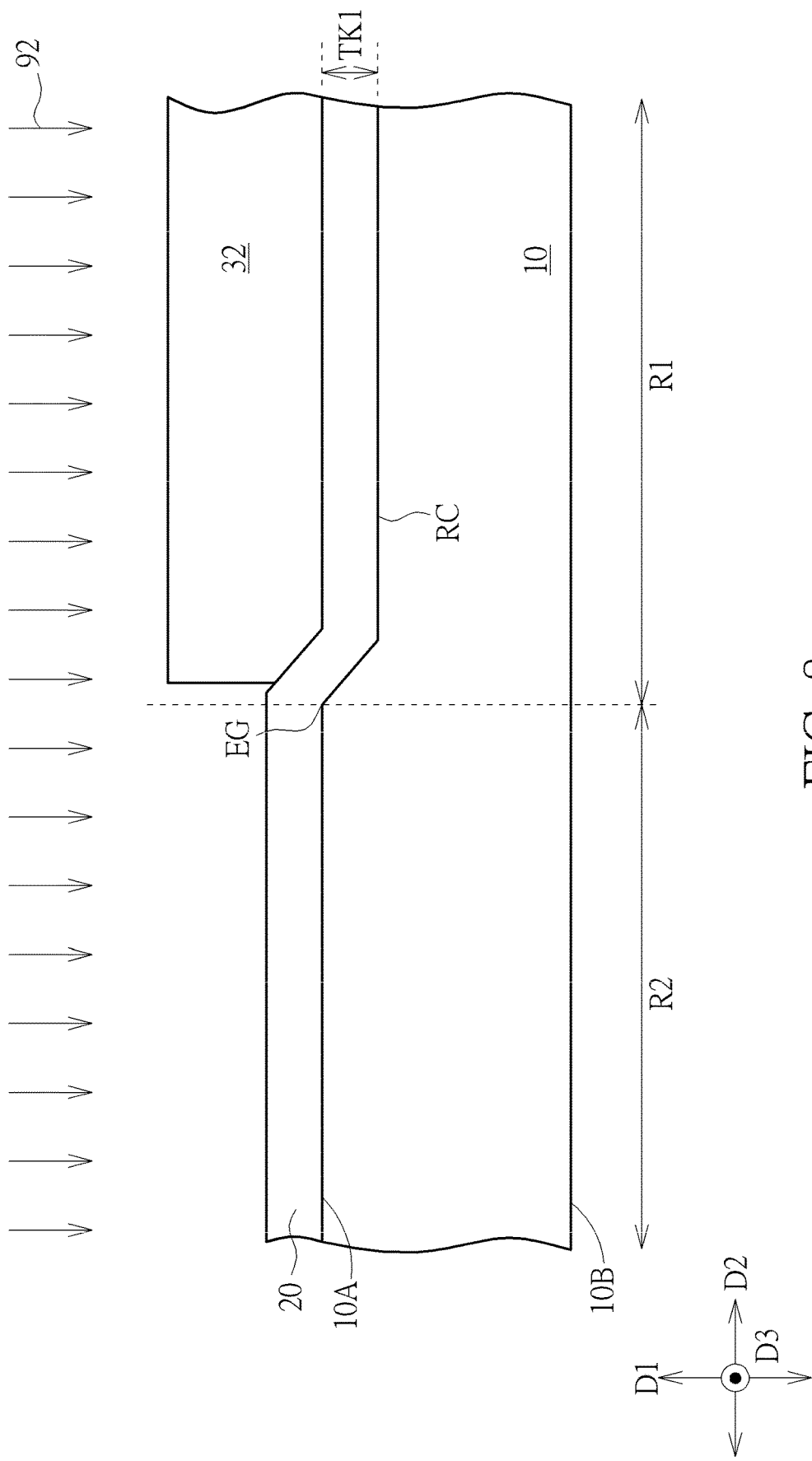
Figure 9:
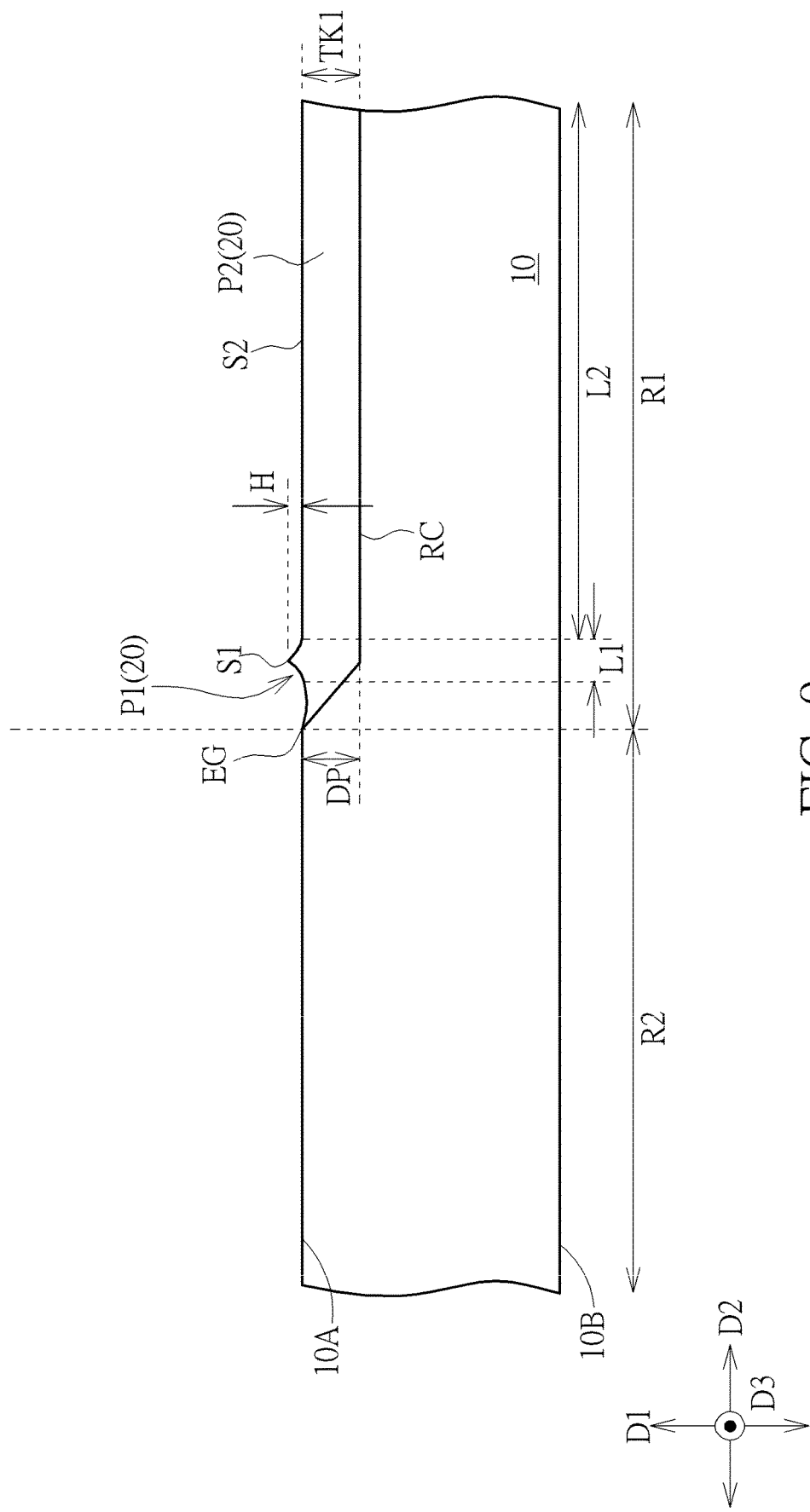
Figure 10:
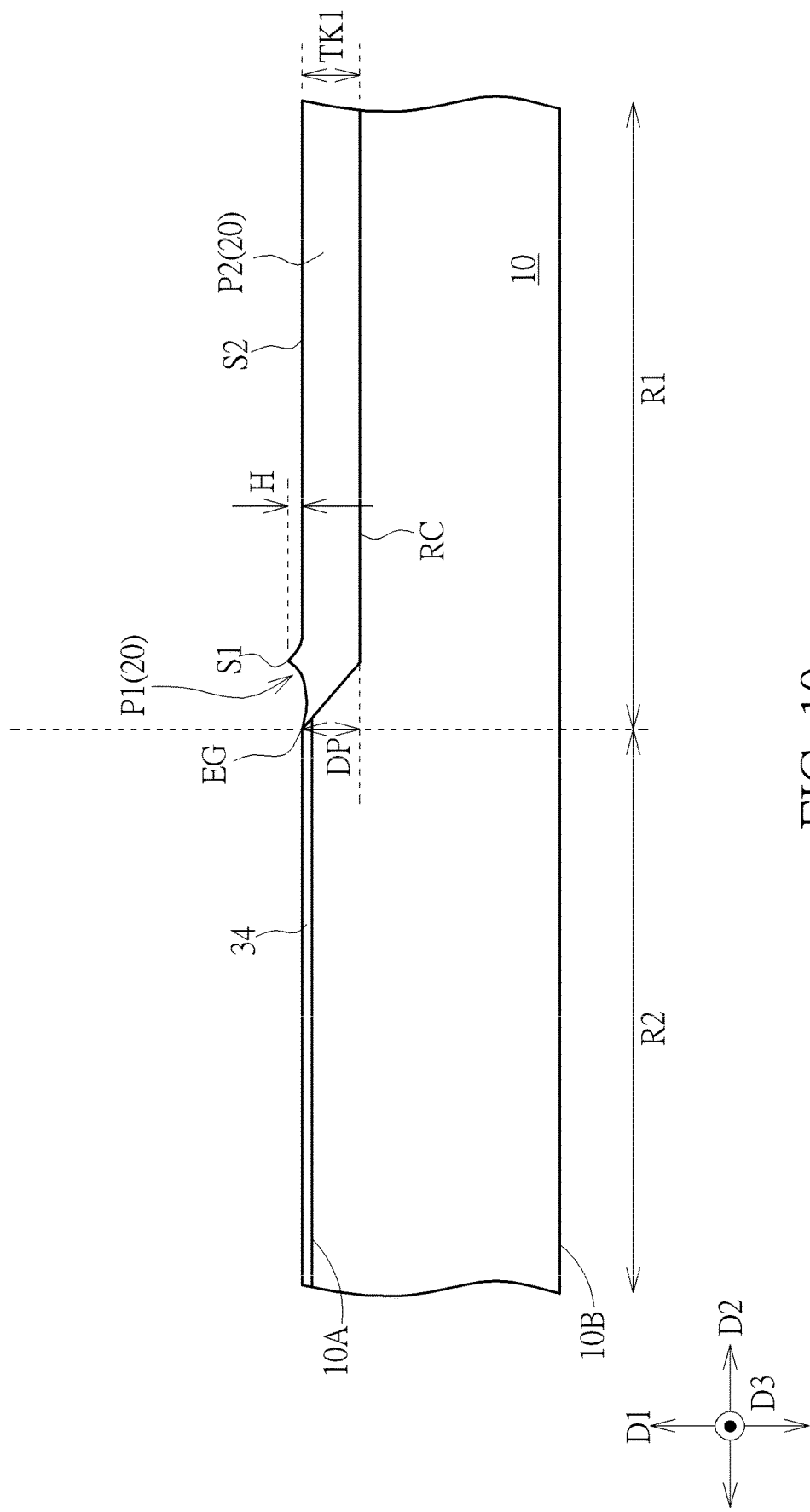

Please refer to FIGS. 1-10. FIGS. 3-10 are schematic drawings illustrating a manufacturing method of the semiconductor device according to the first embodiment of the present invention, wherein FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, FIG. 10 is a schematic drawing in a step subsequent to FIG. 9, and FIG. 1 may be regarded as a schematic drawing in a step subsequent to FIG. 10. As shown in FIG. 1, the manufacturing method of the semiconductor device 101 in this embodiment may include the following steps. Firstly, the semiconductor substrate 10 is provided. The semiconductor substrate 10 includes the first region R1 and the second region R2 adjacent to the first region R1. The recess RC is formed in the first region R1 of the semiconductor substrate 10, and the edge EG of the recess RC is located at the interface between the first region R1 and the second region R2. The first gate oxide layer 20 is formed on the semiconductor substrate 10, and at least a part of the first gate oxide layer 20 is disposed in the recess RC. The first gate oxide layer 20 includes the hump portion P1 disposed adjacent to the edge EG of the recess RC, and the height H of the hump portion P1 is less than the depth DP of the recess RC. The gate structure GS is formed on the first region R1 and the second region R2 of the semiconductor substrate 10, and the gate structure GS overlaps the hump portion P1 of the first gate oxide layer 20 in the vertical direction (such as the first direction D1).

Specifically, the manufacturing method in this embodiment may include but is not limited to the following steps. For example, the step of forming the recess RC described above may include but is not limited to the following steps. Firstly, as shown in FIG. 3, a pad oxide layer 12 is formed on the semiconductor substrate 10, and a mask layer 14 is formed on the pad oxide layer 12. In some embodiments, the pad oxide layer 12 may include silicon oxide or other suitable oxide materials, and the mask layer 14 may include silicon nitride or other suitable mask materials. In addition, the pad oxide layer 12 and the mask layer 14 may be globally formed on the semiconductor substrate 10, and the pad oxide layer 12 and the mask layer 14 may be formed on the first region R1 and the second region R2 accordingly. Subsequently, as shown in FIG. 3 and FIG. 4, a part of the pad oxide layer 12 and a part of the mask layer 14 may be removed for exposing a portion of the first region R1 of the semiconductor substrate 10. In some embodiments, the method of removing a part of the pad oxide layer 12 and a part of the mask layer 14 described above may include a photolithographic process or other suitable patterning approaches, and the location of the pad oxide layer 12 and the mask layer 14 shown in FIG. 4 may be defined by the mask pattern M2 shown in FIG. 2 described above. For example, a part of the mask layer 14 and a part of the pad oxide layer 12 may be etched to be the mask layer 14 and the pad oxide layer 12 shown in FIG. 4, but not limited thereto.

Subsequently, as shown in FIG. 4 and FIG. 5, an oxidation process 91 may be performed to the exposed portion of the first region R1 of the semiconductor substrate 10 for forming an expanded oxide layer 16, and the expanded oxide layer 16 may be partially embedded in the semiconductor substrate 10 and connected with the pad oxide layer 12. In some embodiments, the oxidation process 91 may include a thermal oxidation process or other suitable oxidation approaches for oxidizing the exposed semiconductor substrate 10 and forming the expanded oxide layer 16. In some embodiments, a portion of the semiconductor substrate 10 covered by the mask layer 14 and the pad oxide layer 12 may be oxidized by the oxidation process 91 also to be a part of the expanded oxide layer 16, and the mask layer 14 at the edge may be lifted up by the expanded oxide layer 16 accordingly, but not limited thereto. Additionally, in some embodiments, the interface between the expanded oxide layer 16 and the pad oxide layer 12 may substantially overlap the interface between the first region R1 and the second region R2 in the first direction D1 by modifying the process parameters (such as time, temperature, and so on) of the oxidation process 91 for controlling the dimension of the expanded oxide layer 16, but not limited thereto.

As shown in FIG. 5 and FIG. 6, the expanded oxide layer 16, the pad oxide layer 12, and the mask layer 14 may then be removed for forming the recess RC. In other words, the depth DP of the recess RC may be controlled by modifying the oxidation process 91 for controlling the thickness of the expanded oxide layer 16. In some embodiments, the depth DP of the recess RC may be equal to a height difference and/or a distance between the bottom surface BS of the recess RC and the top surface 10A of the semiconductor substrate 10 in the first direction D1. Additionally, the depth DP of the recess RC may also be equal to a height difference and/or a distance between the bottom surface BS of the recess RC and the edge EG of the recess RC in the first direction D1.

Subsequently, as shown in FIG. 7, the first gate oxide layer 20 is formed on the semiconductor substrate 10. In some embodiments, the first gate oxide layer 20 may be globally formed on the semiconductor substrate 10, and the first gate oxide layer 20 may be formed on the first region R1 and the second region R2 accordingly. Additionally, in some embodiments, the first gate oxide layer 20 may include a single layer or multiple layers of oxide materials. For example, the first gate oxide layer 20 may include a first layer 22 and a second layer 24 disposed on the first layer 22, and the method used to form the second layer 24 may be different from the method used to form the first layer 22. In some embodiments, the first layer 22 may include an oxide layer formed by an in-situ-steam-generation (ISSG) process, and the second layer 24 may include an oxide layer formed by an atomic layer deposition (ALD) process for controlling the thickness of the first gate oxide layer 20 more precisely when it is formed, but not limited thereto.

Subsequently, as shown in FIG. 8 and FIG. 9, a patterned mask layer 32 is formed on the first gate oxide layer 20, and an etching process 92 is performed to the first gate oxide layer 20 with the patterned mask layer 32 as a mask for removing the first gate oxide layer 20 formed on the second region R2 and forming the hump portion P1 of the first gate oxide layer 20. In some embodiments, the patterned mask layer 32 may be removed after the etching process 92, and the patterned mask layer 32 may be defined by the mask pattern M1 shown in FIG. 2 described above, but not limited thereto. In some embodiments, the first gate oxide layer 20 on the recess RC may not be completely covered by the patterned mask layer 32 for avoiding the excessive height H of the formed hump portion P1 and generating negative influence. In other words, the first gate oxide layer 20 formed on the second region R2 and a part of the first gate oxide layer 20 formed above the recess RC may be exposed after forming the patterned mask layer 32 and during the etching process 92, and the height H of the hump portion P1 may be reduced by etching the first gate oxide layer 20 with relatively greater thickness and located around the edge EG of the recess RC in the etching process 92 accordingly, but not limited thereto. In some embodiments, the conditions of the recess RC and the first gate oxide layer 20 formed above the recess RC (such as the height, the location, and the dimension of the hump portion P1) may be controlled by modifying the mask pattern M1, the mask pattern M2, and/or the spacing SP between the mask pattern M1 and the mask pattern M2 shown in FIG. 2 described above, but not limited thereto.

As shown in FIG. 10, after the step of forming the first gate oxide layer 20, the second gate oxide layer 34 may be formed on the second region R2 of the semiconductor substrate 10, and the second gate oxide layer 34 may be thinner than the first gate oxide layer 20. In some embodiments, the second gate oxide layer 34 may be formed by performing an oxidation treatment to the second region R2 of the semiconductor substrate 10, a part of the semiconductor substrate 10 may be oxidized to be at least a portion of the second gate oxide layer 34, and the top surface 10A of the semiconductor substrate 10 may be slightly lowered after the step of forming the second gate oxide layer 34 accordingly, but not limited thereto. The oxidation treatment described above may include a thermal oxidation treatment, a chemical oxidation treatment, or other suitable oxidation approaches, and the second gate oxide layer 34 may also be formed by other suitable approaches (such as a deposition process) according to some design considerations.

Subsequently, as shown in FIG. 10 and FIG. 1, the gate dielectric layer HK and the gate structure GS described above may be formed on the first gate oxide layer 20 and the second gate oxide layer 34, and the gate structure GS may overlap the first gate oxide layer 20 and the second gate oxide layer 34 in the first direction D1, respectively. In some embodiments, the gate dielectric layer HK and the gate structure GS may be formed by a replacement metal gate (RMG) process, but not limited thereto. The negative influence of the disposition of the relatively thicker first gate oxide layer 20 on the gate structure GS and the process of forming the gate structure GS (such as the RMG process described above) may be reduced by forming the relatively thicker first gate oxide layer 20 in the recess RC and controlling the height H of the hump portion P1 of the first gate oxide layer 20, and the electrical performance and/or the manufacturing yield of the semiconductor device may be improved accordingly.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 11:
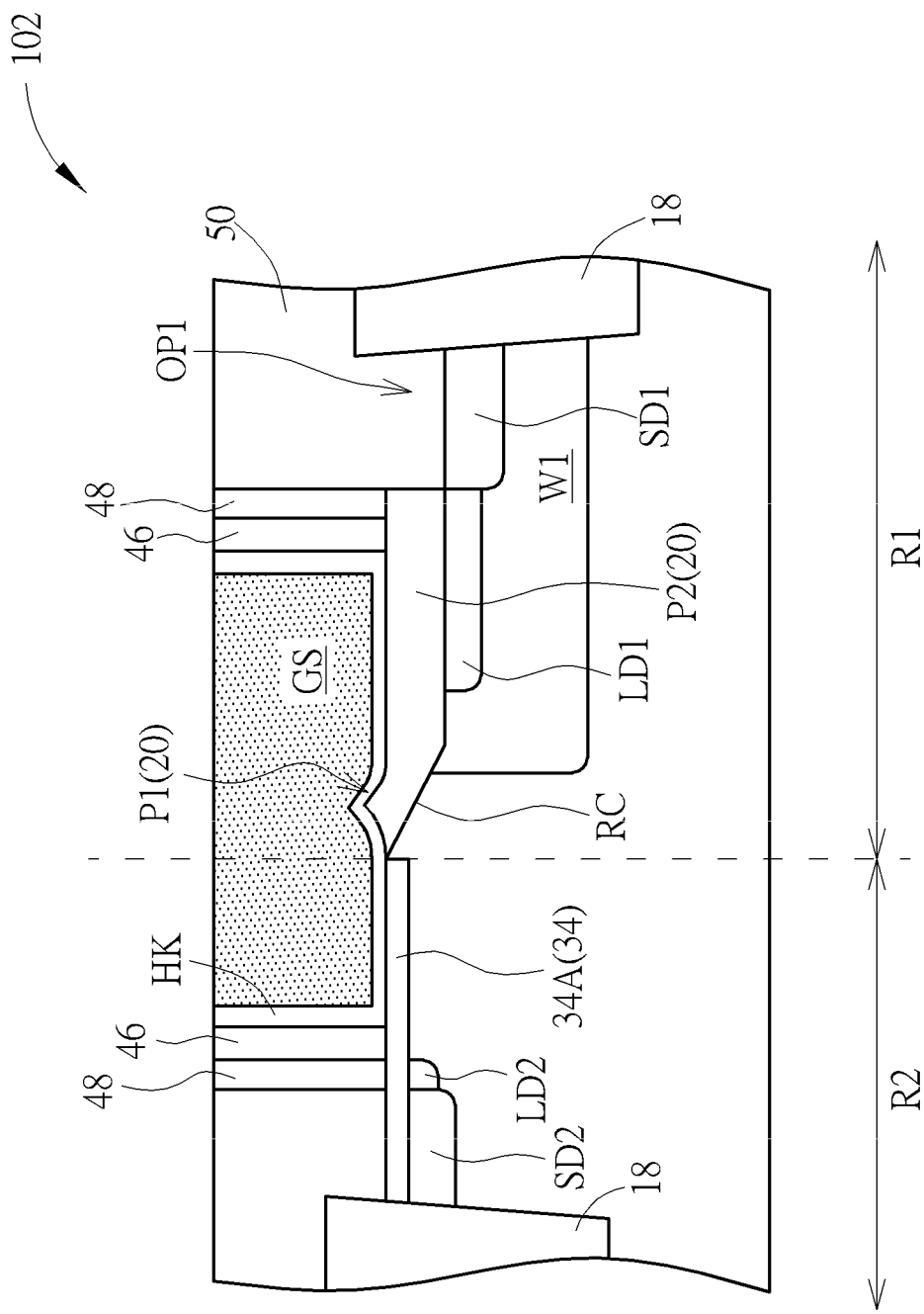
FIG. 11 is a schematic drawing illustrating a semiconductor device according to a second embodiment of the present invention.

Please refer to FIG. 11. FIG. 11 is a schematic drawing illustrating a semiconductor device 102 according to a second embodiment of the present invention. As shown in FIG. 11, the semiconductor device 102 may further include an isolation structure 18, a first spacer 46, a second spacer 48, a dielectric layer 50, a lightly doped region LD1, a lightly doped region LD2, a well region W1, a source/drain region SD1, and a source/drain region SD2. At least a part of the isolation structure 18 may be disposed in the semiconductor substrate 10, and the isolation structure 18 may include a single layer or multiple layers of insulation materials, such as oxide insulation materials (silicon oxide and/or polysilazane, for example), or other suitable insulation materials. The lightly doped region LD1, the lightly doped region LD2, the well region W1, the source/drain region SD1, and the source/drain region SD2 may include a doped region formed in the semiconductor substrate 10 by a doping process (such as an implantation process), respectively. The source/drain region SD1 and the source/drain region SD2 may be formed in the semiconductor substrate 10 and located at two opposite sides of the gate structure GS in the second direction D2, respectively. The lightly doped region LD1 may be disposed adjacent to the source/drain region SD1, and the lightly doped region LD2 may be disposed adjacent to the source/drain region SD2.

In some embodiments, the source/drain region SD1 may be used as a drain region of a high voltage semiconductor unit, and the source/drain region SD2 may be used as a source region of the high voltage semiconductor unit, but not limited thereto. The well region W1 may be disposed in the semiconductor substrate 10 and partially located under the first gate oxide layer 20, and the lightly doped region LD1 and the source/drain region SD1 may be disposed in the well region W1. The first spacer 46 and the second spacer 48 may be disposed on the sidewalls of the gate structure GS, and the dielectric layer 50 may be disposed on the semiconductor substrate 10 and surround the first spacer 46 and the second spacer 48. In some embodiments, the first spacer 46, the second spacer 48, and the dielectric layer 50 may include a dielectric material, respectively, such as silicon oxide, silicon nitride, silicon oxynitride, or other suitable dielectric materials. In some embodiments, the semiconductor device 102 may further include an opening OP1. The opening OP1 may penetrate through the first gate oxide layer 20 in the first direction D1, and the source/drain region SD1 may be disposed corresponding to the opening OP1 in the first direction D1. Accordingly, the top surface of the source/drain region SD1 may be lower than the top surface of the source/drain region SD2 in the first direction D1, but not limited thereto.

Figure 12:
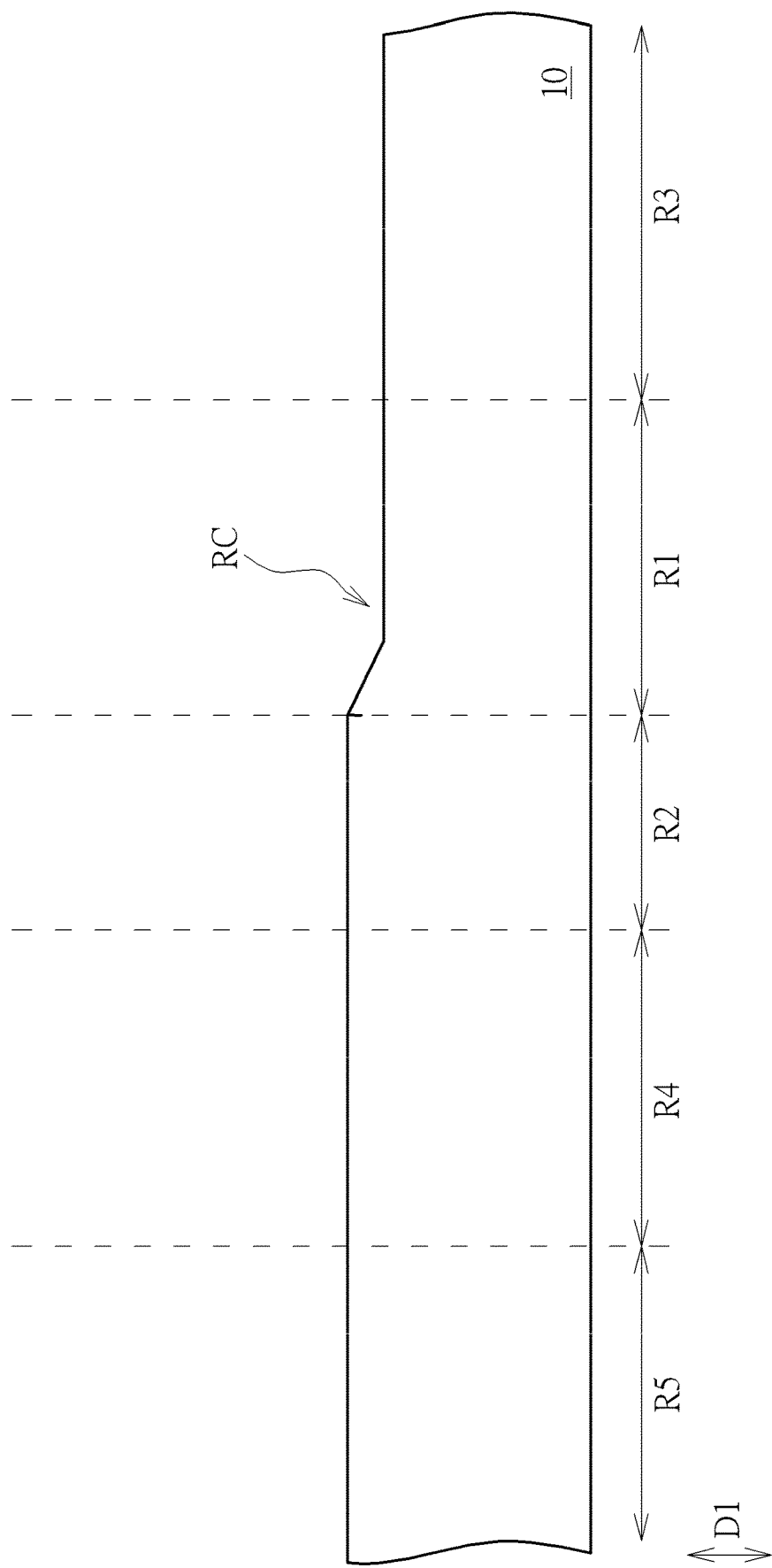
Figure 13:
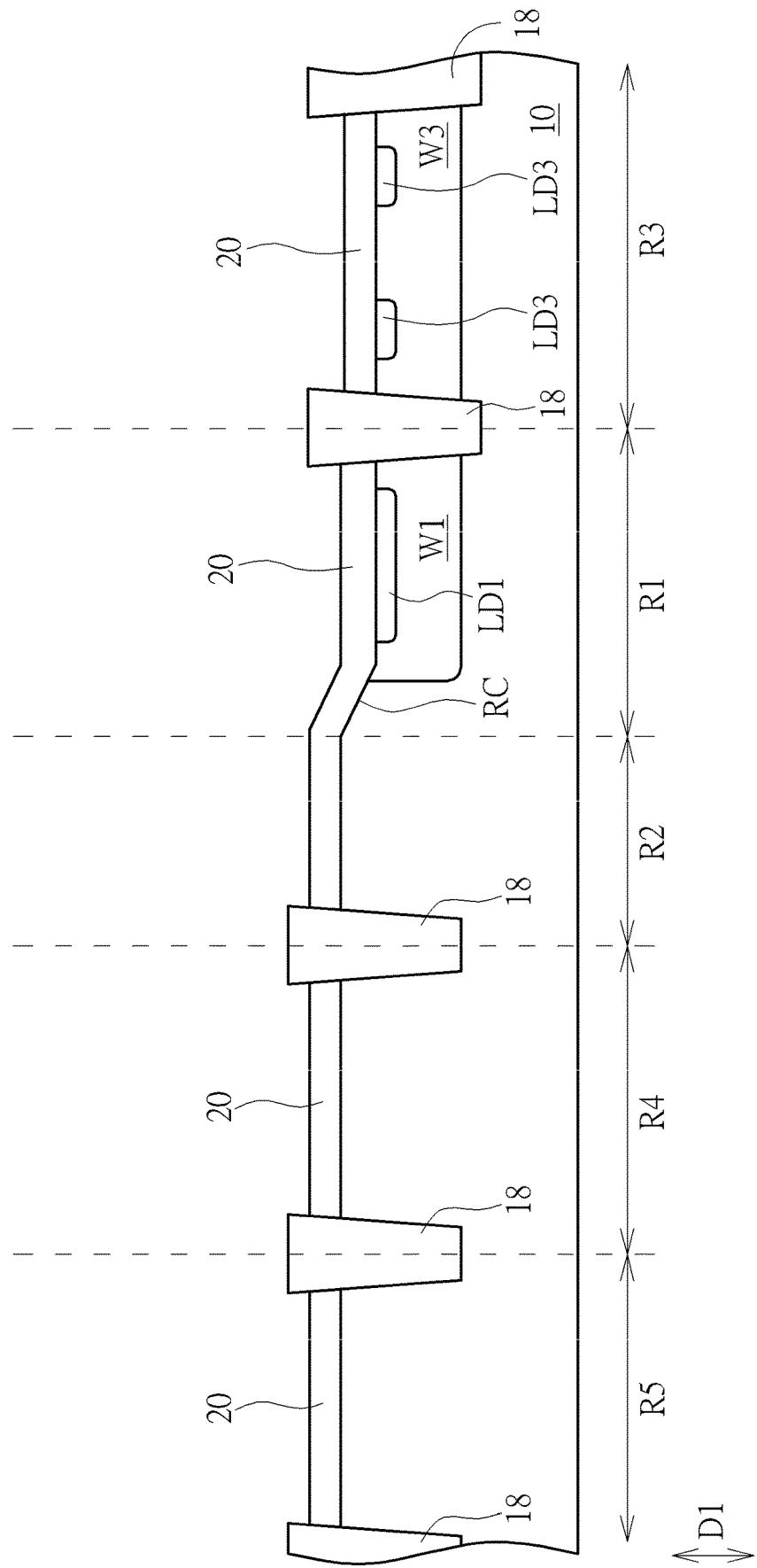
Figure 14:
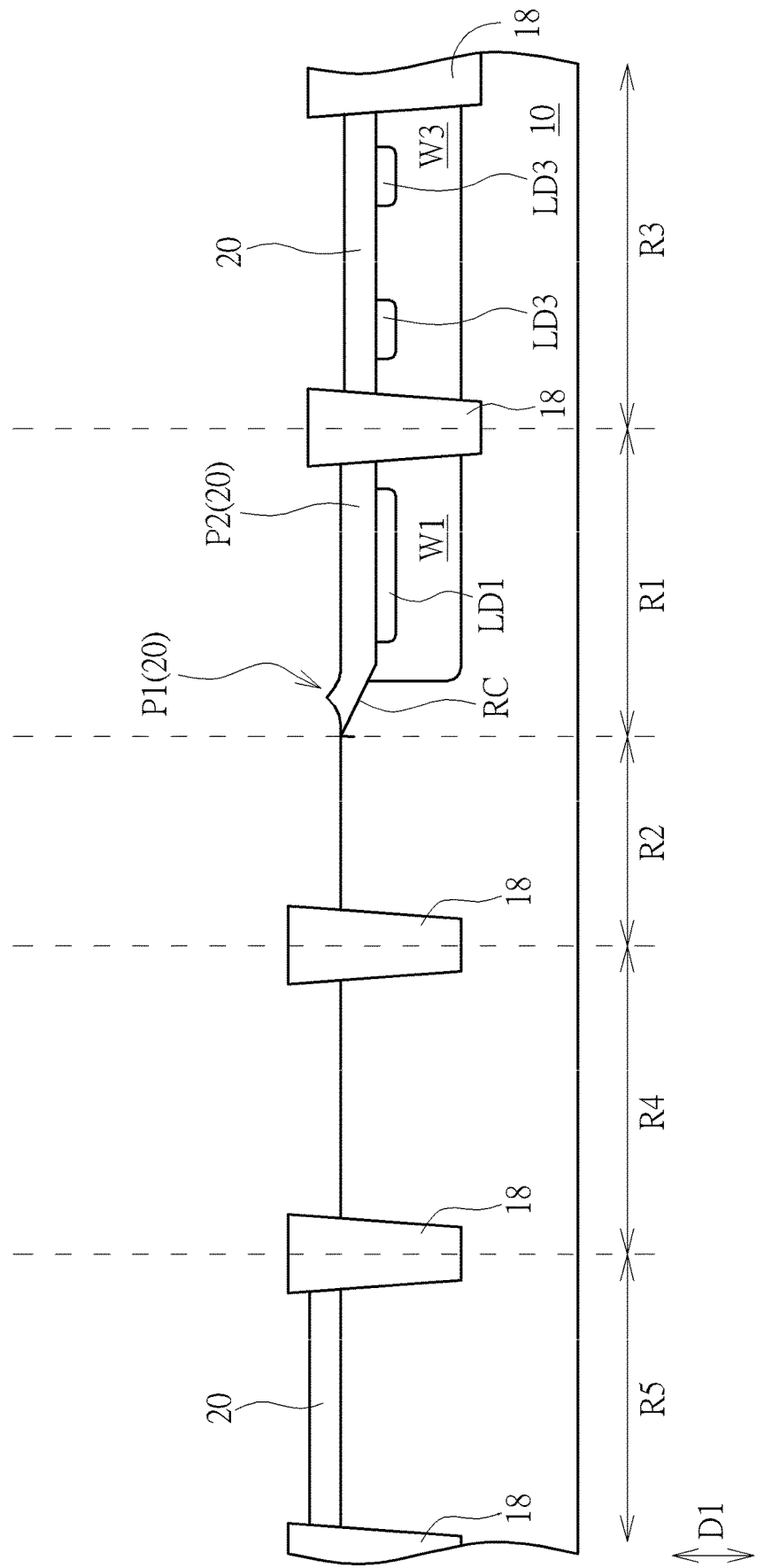
Figure 15:
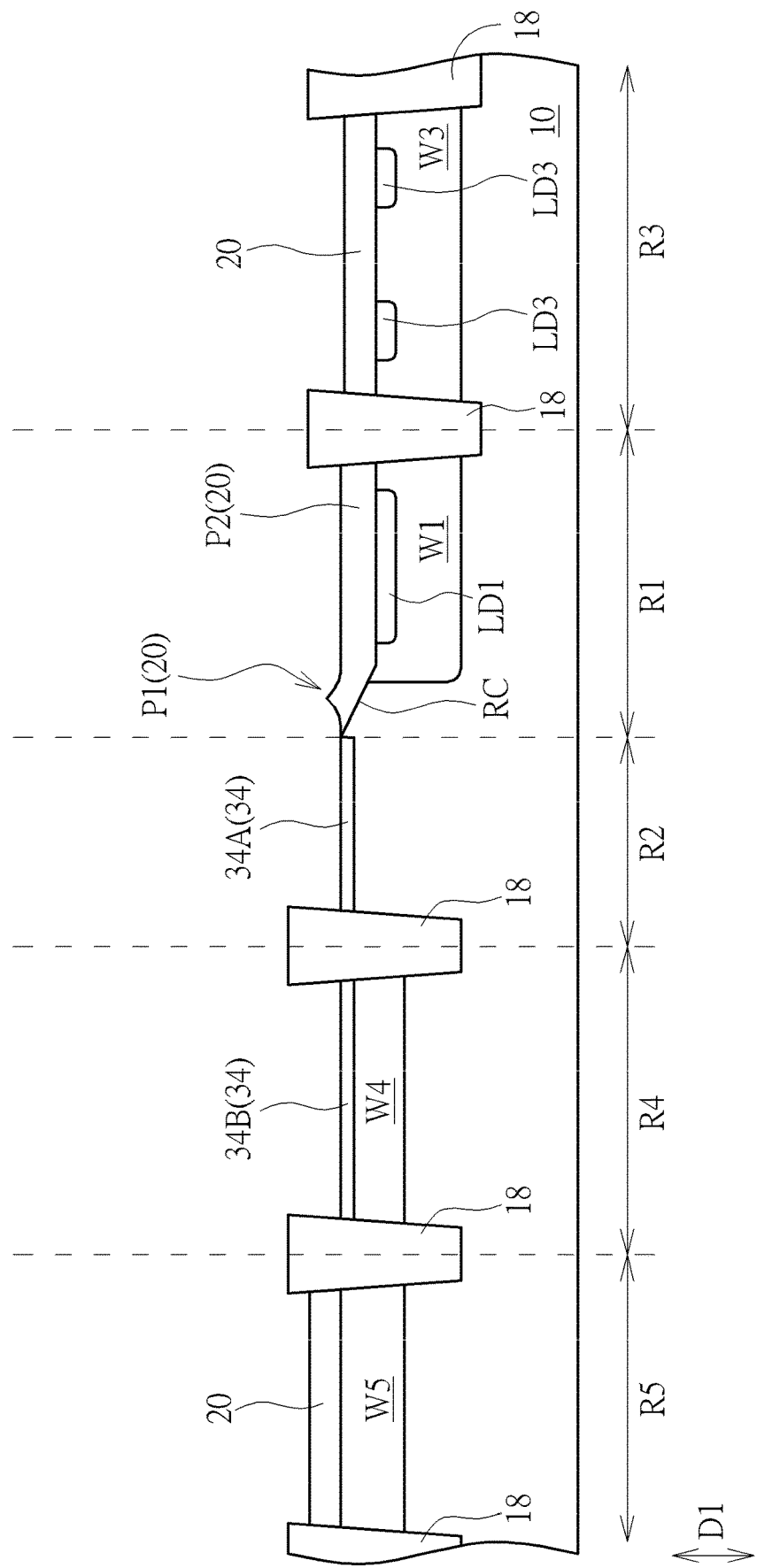
Figure 16:
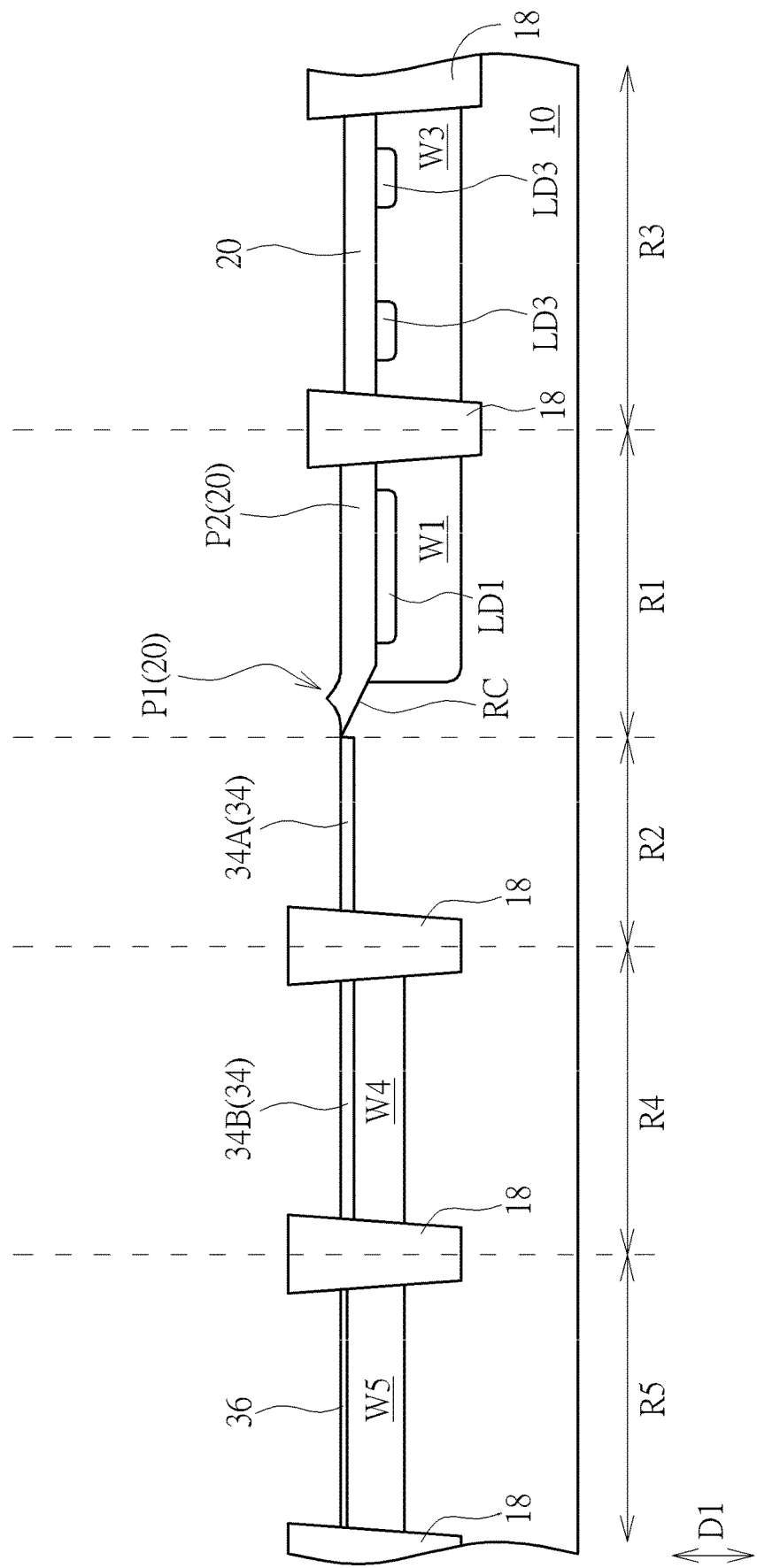
Figure 17:
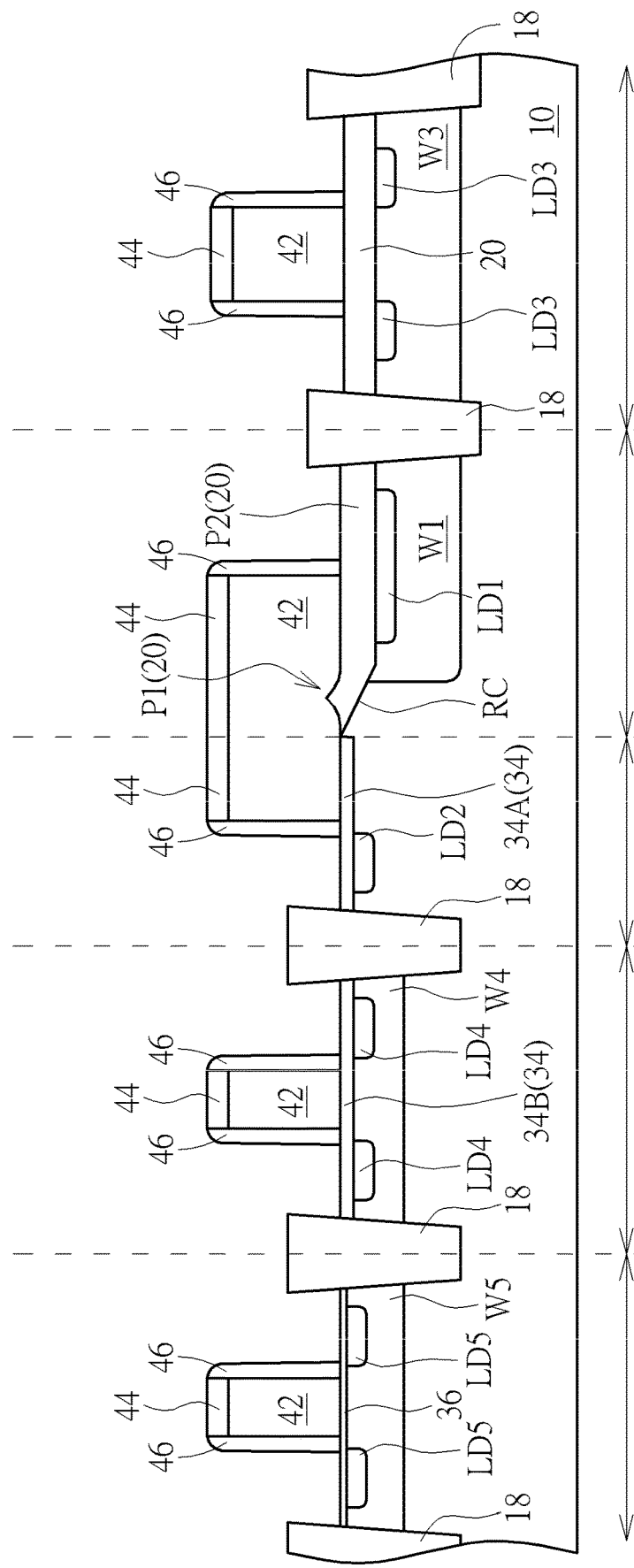
Figure 18:
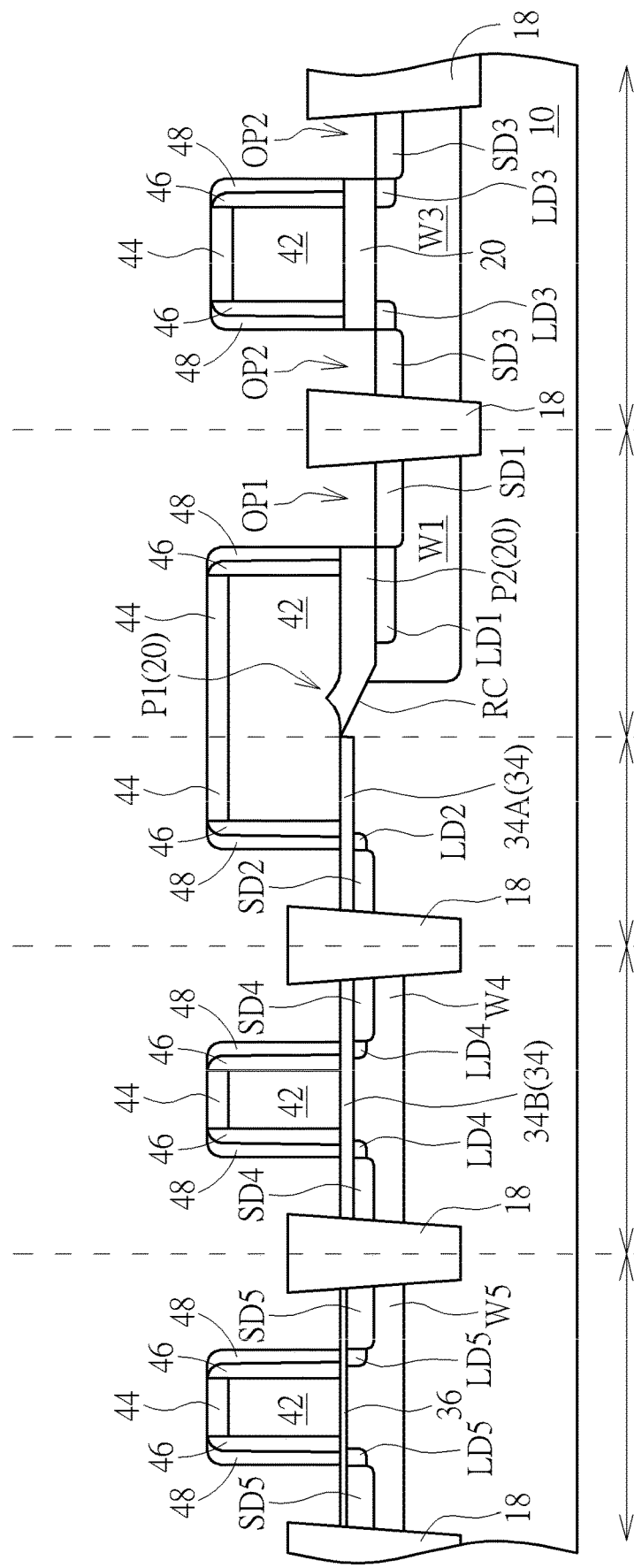

Please refer to FIGS. 11-18. FIGS. 12-18 are schematic drawings illustrating a manufacturing method of the semiconductor device in this embodiment, wherein FIG. 13 is a schematic drawing in a step subsequent to FIG. 12, FIG. 14 is a schematic drawing in a step subsequent to FIG. 13, FIG. 15 is a schematic drawing in a step subsequent to FIG. 14, FIG. 16 is a schematic drawing in a step subsequent to FIG. 15, FIG. 17 is a schematic drawing in a step subsequent to FIG. 16, FIG. 18 is a schematic drawing in a step subsequent to FIG. 17, and FIG. 11 may be regarded as a schematic drawing in a step subsequent to FIG. 18. The manufacturing method of the semiconductor device in this embodiment may include but is not limited to the following steps. Firstly, as shown in FIG. 12, the semiconductor substrate 10 is provided, and the recess RC is formed in the semiconductor substrate 10. The method of forming the recess RC in this embodiment may be similar to that in the first embodiment described above and will not be redundantly described accordingly. It is worth noting that the semiconductor substrate 10 in this embodiment may further include a third region R3, a fourth region R4, and a fifth region R5, and the recess RC may be disposed in the first region R1 and the third region R3 of the semiconductor substrate 10.

Subsequently, as shown in FIG. 13, the isolation structure 18, the well region W1, the lightly doped region LD1, a well region W3, a lightly doped region LD3, a the first gate oxide layer 20 are formed. In some embodiments, the isolation structure 18 may be partly formed at the interface between the first region R1 and the third region R3, partly formed at the interface between the second region R2 and the fourth region R4, and partly formed at the interface between the fourth region R4 and the fifth region R5, but not limited thereto. The well region W1 and the lightly doped region LD1 may be formed in the first region R1, and the well region W3 and the lightly doped region LD3 may be formed in the third region R3. The first gate oxide layer 20 may be formed on the first region R1, the second region R2, the third region R3, the fourth region R4, and the fifth region R5, and the first gate oxide layer 20 may be partially located in the recess RC. As shown in FIG. 13 and FIG. 14, the first gate oxide layer 20 on the second region R2 and the fourth region R4 is removed for forming the first gate oxide layer 20 including the hump portion P1 and the main portion P2 described above. As shown in FIG. 14 and FIG. 15, the second gate oxide layer 34 described above is then formed, and a well region W4 and a well region W5 are formed in the semiconductor substrate 10. A first portion 34A of the second gate oxide layer 34 may be formed on the second region R2, and a second region 34B of the second gate oxide layer 34 may be formed on the fourth region R4. The well region W4 may be formed in the fourth region R4 and located under the second portion 34B of the second gate oxide layer 34, and the well region R5 may be formed in the fifth region R5 and located under the first gate oxide layer 20.

Subsequently, as shown in FIG. 15 and FIG. 16, the first gate oxide layer 20 on the fifth region R5 may be removed, and a third gate oxide layer 36 may be formed on the fifth region R5. In some embodiments, the third gate oxide layer 36 may be thinner than the second gate oxide layer 34, but not limited thereto. As shown in FIG. 17, a plurality of dummy gate structures 42, a plurality of gate cap layers 44, and a plurality of the first spacers 46 may be then be formed on the semiconductor substrate 10. At least one of the dummy gate structures 42 may be formed on the first region R1 and the second region R2 and partially overlap the first gate oxide layer 20 and the second gate oxide layer 34 in the first direction D1, respectively. In addition, at least one of the dummy gate structures 42 may be formed on the third region R3, at least one of the dummy gate structures 42 may be formed on the fourth region R4, and at least one of the dummy gate structures 42 may be formed on the fifth region R5, but not limited thereto. Each of the gate cap layers 44 may be disposed on the corresponding dummy gate structure 42, and each of the first spacers 46 may be disposed on the sidewall of the corresponding dummy gate structure 42. In some embodiments, the dummy gate structure 42 may include a silicon-containing material, such as polysilicon, amorphous silicon, or other suitable materials, and the gate cap layer 44 may include silicon nitride or other suitable dielectric materials.

Subsequently, the lightly doped region LD2, lightly doped regions LD4, and lightly doped regions LD5 may be formed in the second region R2, the fourth region R4, and the fifth region R5, respectively. In some embodiments, two lightly doped regions LD3 may be formed in the third region R3 and located at two opposite sides of the dummy gate structure 42 on the third region R3, respectively; two lightly doped regions LD4 may be formed in the fourth region R4 and located at two opposite sides of the dummy gate structure 42 on the fourth region R4, respectively; and two lightly doped regions LD5 may be formed in the fifth region R5 and located at two opposite sides of the dummy gate structure 42 on the fifth region R5, respectively, but not limited thereto. The lightly doped region LD3, the lightly doped region LD4, and the lightly doped region LD 5 may include an identical dopant or different dopants according to the characteristics of the semiconductor units going to be formed.

As shown in FIG. 18, the second spacer 48 are formed on the sidewall of each of the first spacers 46, and the source/drain region SD1, the source/drain region SD2, source/drain regions SD3, source/drain regions SD4, and source/drain regions SD5 are formed in the semiconductor substrate 10. It is worth noting that, for avoiding the influence of the relatively thicker first gate oxide layer 20 on the formation of the source/drain region SD1 and the source/drain regions SD3, the opening OP1 and openings OP2 may be formed penetrating through the first gate oxide layer 20 on the first region R1 and the first gate oxide layer 20 on the third region R3, respectively, for exposing portions of the semiconductor substrate 10 corresponding to the source/drain region SD1 and the source/drain regions SD3, and the source/drain region SD1 and the source/drain regions SD3 may then be formed in the semiconductor substrate 10 by a doping process (such as an implantation process). Therefore, the source/drain region SD1 may be formed corresponding to the opening OP1 in the first direction D1, and each of the source/drain regions SD3 may be formed corresponding to the opening OP2 in the first direction D1. In some embodiments, the source/drain region SD1 and the source/drain region SD2 are located at two opposite sides of the dummy gate structure 42 disposed on the first region R1 and the second region R2; two source/drain regions SD3 may be formed in the third region R3 and located at two opposite sides of the dummy gate structure 42 on the third region R3; two source/drain regions SD4 may be formed in the fourth region R4 and located at two opposite sides of the dummy gate structure 42 on the fourth region R4; and two source/drain regions SD5 may be formed in the fifth region R5 and located at two opposite sides of the dummy gate structure 42 on the fifth region R5, but not limited thereto.

As shown in FIG. 18 and FIG. 11, in some embodiments, the dummy gate structure 42 on the first region R1 and the second region R2 may overlap the hump portion P1 of the first gate oxide layer 20 in the first direction D1. In addition, a replacement metal gate process may be used to remove the dummy gate structures 42 and replacing the dummy gate structures 42 with the gate structures GS, but not limited thereto. Specifically, in some embodiments, after the step of forming the source/drain region SD1, the source/drain region SD2, the source/drain regions SD3, the source/drain regions SD4, and the source/drain regions SD5, the dielectric layer 50 may be formed globally on the semiconductor substrate 10 for covering each of the dummy gate structures 42. A planarization process may then be performed to remove a part of the dielectric layer 50 and the gate cap layers 44 may be removed for exposing each of the dummy gate structures 42. Subsequently, trenches surrounding by the spacers may be formed on each region by removing the exposed dummy gate structures 42, and the gate dielectric layer HK and the gate structure GS may be formed in each trench. The planarization process described above may include a chemical mechanical polishing (CMP) process, an etching back process, or other suitable planarization approaches. In some embodiments, the gate dielectric layer HK may be formed on the semiconductor substrate 10 after the step of removing the dummy gate structure 42 and before the step of forming the gate structure GS, and the gate dielectric layer HK may substantially have an U-shaped structure surrounding the gate structure GS in a cross-sectional diagram of the semiconductor device 102 (such as FIG. 11), but not limited thereto. In addition, the dummy gate structure 42 may also be regarded as being replaced with the gate dielectric layer HK and the gate structure GS, but not limited thereto.

In some embodiments, operations with different voltages may be performed to the semiconductor device 102 formed on the first region R1 and the second region R2 because of the gate oxide layers of different thicknesses; operations with relatively higher voltage may be performed to the semiconductor unit formed on the third region R3 because of the relatively thicker gate oxide layer in the semiconductor unit formed on the third region R3; operations with relatively lower voltage may be performed to the semiconductor unit formed on the fourth region R4 because of the relatively thinner gate oxide layer in the semiconductor unit formed on the fourth region R4; and the semiconductor unit formed on the fifth region R5 may correspond to an unit requiring a further thinner gate oxide layer (such as a core unit), but not limited thereto. In other words, the semiconductor units corresponding to different operation voltages may be formed concurrently by the manufacturing method in this embodiment for process integration. In addition, the negative influence of the disposition of the relatively thicker first gate oxide layer 20 on the gate structure GS and the process of forming the gate structure GS (such as the replacement metal gate process described above) may be reduced by forming the relatively thicker first gate oxide layer 20 in the recess RC and controlling the height of the hump portion P1 of the first gate oxide layer 20, and the electrical performance and/or the manufacturing yield of the semiconductor device may be improved accordingly.

Figure 19:
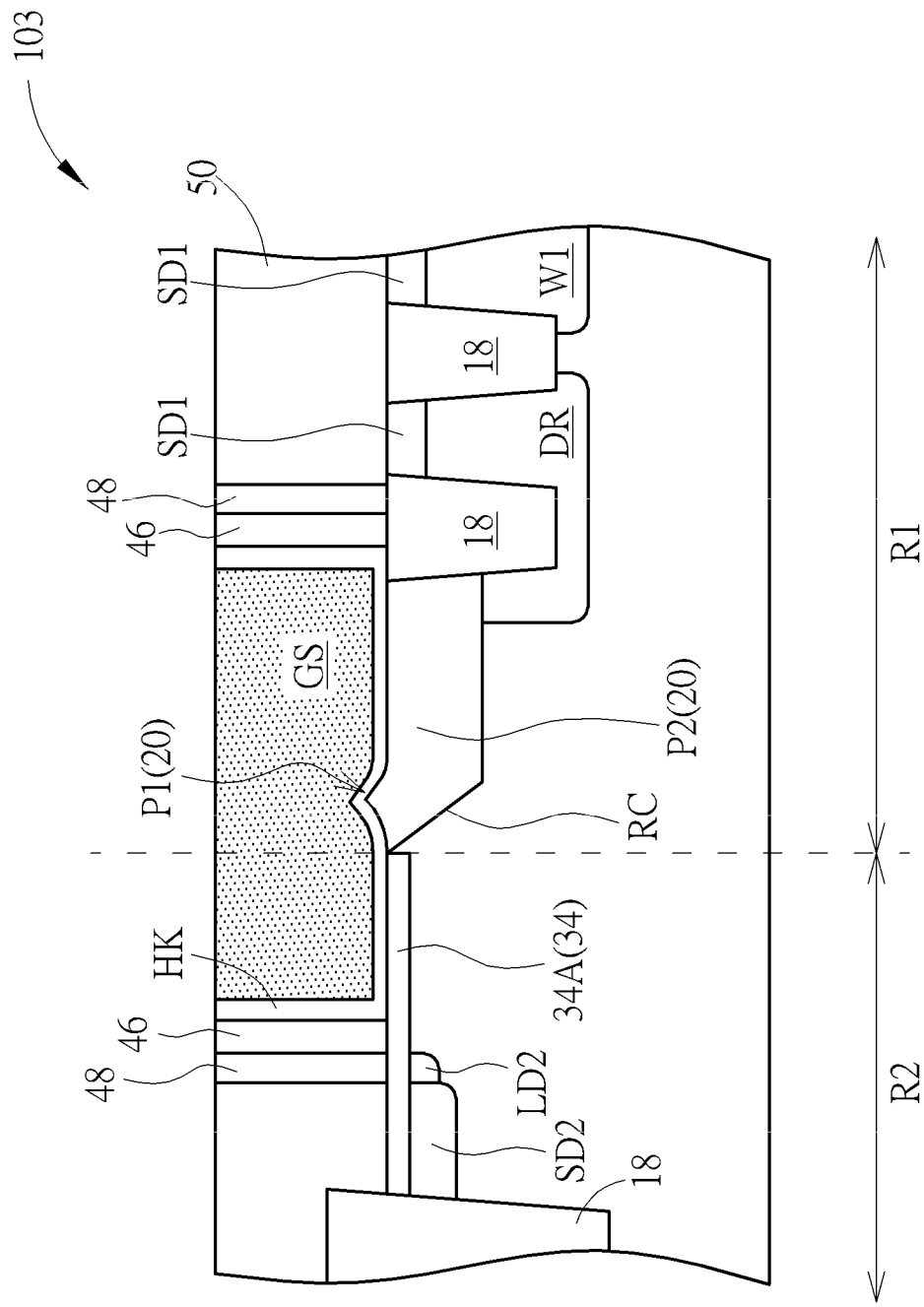
FIG. 19 is a schematic drawing illustrating a semiconductor device according to a third embodiment of the present invention.

Please refer to FIG. 19. FIG. 19 is a schematic drawing illustrating a semiconductor device 103 according to a third embodiment of the present invention. As shown in FIG. 19, the semiconductor device 103 may further include a drift region DR disposed in the semiconductor substrate 10 and partly located under the first gate oxide layer 20 in the first direction D1. In other words, the manufacturing method of the semiconductor device 103 may further include forming the drift region DR in the semiconductor substrate 10. In some embodiments, a part of the drain region of the semiconductor device 103 (such as the source/drain region SD1) may be disposed in the drift region DR and a part of the drain region may be disposed in the well region W1. In some embodiments, a portion of the isolation structure 18 may be located in the drift region DR and located between the first gate oxide layer 20 and the source/drain region SD1 in the second direction D2, and another portion of the isolation structure 18 may be located between the drift region DR and the well region W1, but not limited thereto. In some embodiments, the semiconductor substrate 10 may have a first conductivity type or include a first conductivity type region, and the drift region DR and the well region W1 may have a second conductivity type complementary to the first conductivity type, but not limited thereto. For example, the first conductivity type described above may be p-type, and the second conductivity type described above may be n-type. Therefore, the semiconductor substrate 10 may be a p-type semiconductor substrate or a semiconductor substrate including a p-type well; the drift region DR and the well region W1 may be an n-type well, respectively; and the source/drain region SD1, the source/drain region SD2, and the lightly doped region LD2 may be an n-type doped region, respectively, but not limited thereto. The voltage withstand capability of the semiconductor device 103 may be further enhanced by the disposition of the drift region DR in this embodiment, and the drift region DR in this embodiment may be applied to other embodiments of the present invention according to some design considerations also.

Figure 20:
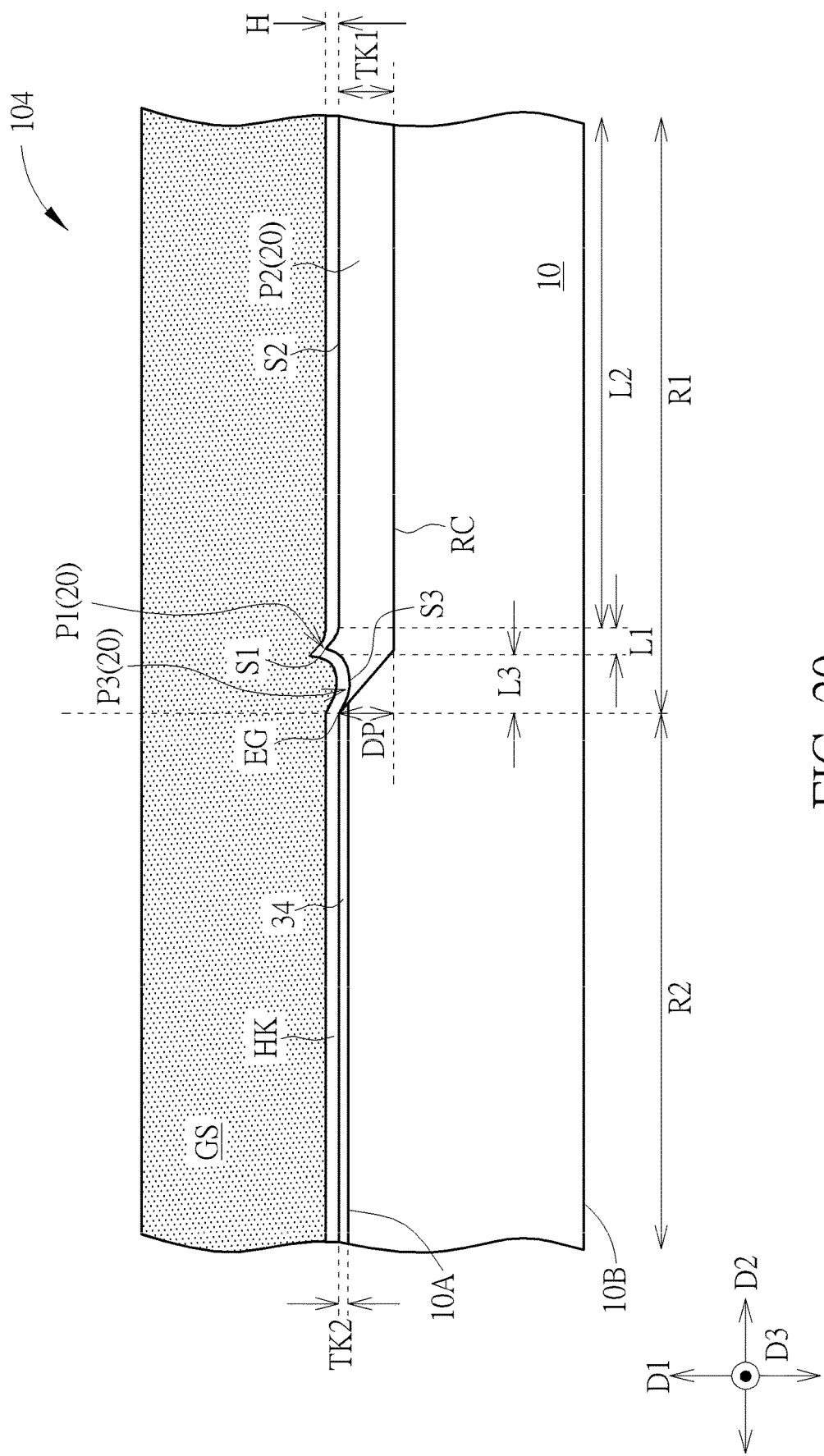
FIG. 20 is a schematic drawing illustrating a semiconductor device according to a fourth embodiment of the present invention.

Please refer to FIG. 20. FIG. 20 is a schematic drawing illustrating a semiconductor device 104 according to a fourth embodiment of the present invention. As shown in FIG. 20, the first gate oxide layer 20 in this embodiment may further include a concave portion P3, and the concave portion P3 may be located between the hump portion P1 and the second gate oxide layer 34 in the second direction D2. A top surface S3 of the concave portion P3 may be lower than the top surface S2 of the main portion P2 in the first direction D1, and a length L3 of the concave portion P3 in the second direction D2 may be less than the length L2 of the main portion P2 in the second direction D2. In some embodiments, the height H of the hump portion P1 of the first gate oxide layer 20 may be further reduced by increasing the spacing SP between the mask pattern M1 and the mask pattern M2 shown in FIG. 2 described above. However, the concave portion P3 in this embodiment may be formed because more first gate oxide layer 20 will be removed by the etching process 92 shown in FIG. 8 under the approach described above. Therefore, the spacing SP between the mask pattern M1 and the mask pattern M2 shown in FIG. 2 described above may be modified according to the design specification of the product for making the height H of the hump portion P1 of the first gate oxide layer 20 meet the requirement and/or determining whether the concave portion P3 can be formed or not.

To summarize the above descriptions, in the semiconductor device and the manufacturing method thereof in the present invention, the gate oxide layer may be disposed in the recess of the semiconductor substrate for increasing the thickness of a portion of the gate oxide layer and reducing the negative influence of the thicker gate oxide layer on the gate structure and the method of forming the gate structure, and the electrical performance and/or the manufacturing yield of the semiconductor device may be improved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a semiconductor substrate, wherein the semiconductor substrate comprises a first region and a second region adjacent to the first region;
   a recess disposed in the first region of the semiconductor substrate, wherein an edge of the recess is located at an interface between the first region and the second region;
   a first gate oxide layer, wherein at least a part of the first gate oxide layer is disposed in the recess, the first gate oxide layer comprises a hump portion disposed adjacent to the edge of the recess, and a height of the hump portion is less than a depth of the recess;
   a gate structure disposed on the first region and the second region of the semiconductor substrate, wherein the gate structure overlaps the hump portion of the first gate oxide layer in a vertical direction;
   a second gate oxide layer disposed on the second region of the semiconductor substrate, wherein the second gate oxide layer is thinner than the first gate oxide layer, and the gate structure further overlaps the second gate oxide layer in the vertical direction; and
   a gate dielectric layer disposed between the gate structure and the semiconductor substrate, wherein a portion of the gate dielectric layer is disposed between the gate structure and the first gate oxide layer in the vertical direction and another portion of the gate dielectric layer is disposed between the gate structure and the second gate oxide layer in the vertical direction.

2. The semiconductor device according to claim 1, wherein the height of the hump portion is less than or equal to 15% of the depth of the recess.

3. The semiconductor device according to claim 1, wherein the first gate oxide layer further comprises:
   a main portion connected with the hump portion, wherein a top surface of the main portion is lower than a top surface of the hump portion in the vertical direction, and a thickness of the main portion is greater than the height of the hump portion.

4. The semiconductor device according to claim 3, wherein the hump portion is disposed between the edge of the recess and at least a part of the main portion in a horizontal direction, and a length of the hump portion in the horizontal direction is less than a length of the main portion in the horizontal direction.

5. The semiconductor device according to claim 3, wherein the gate structure further overlaps the main portion in the vertical direction.

6. The semiconductor device according to claim 3, wherein the thickness of the main portion ranges from 90% of the depth of the recess to 110% of the depth of the recess.

7. The semiconductor device according to claim 1, further comprising:
   an opening penetrating through the first gate oxide layer in the vertical direction; and
   a drain region disposed in the semiconductor substrate and disposed corresponding to the opening in the vertical direction.

8. The semiconductor device according to claim 1, further comprising:
   a drift region disposed in the semiconductor substrate and partly located under the first gate oxide layer in the vertical direction; and
   a drain region, wherein at least a part of the drain region is disposed in the drift region.

9. A manufacturing method of a semiconductor device, comprising:
   providing a semiconductor substrate, wherein the semiconductor substrate comprises a first region and a second region adjacent to the first region;
   forming a recess in the first region of the semiconductor substrate, wherein an edge of the recess is located at an interface between the first region and the second region;
   forming a first gate oxide layer on the semiconductor substrate, wherein at least a part of the first gate oxide layer is disposed in the recess, the first gate oxide layer comprises a hump portion disposed adjacent to the edge of the recess, and a height of the hump portion is less than a depth of the recess;
   forming a second gate oxide layer on the second region of the semiconductor substrate after the step of forming the first gate oxide layer, wherein the second gate oxide layer is thinner than the first gate oxide layer;
   forming a gate structure on the first region and the second region of the semiconductor substrate, wherein the gate structure overlaps the hump portion of the first gate oxide layer in a vertical direction;
   forming a dummy gate structure on the semiconductor substrate, wherein the dummy gate structure overlaps the hump portion of the first gate oxide layer in the vertical direction; and
   removing the dummy gate structure and replacing the dummy gate structure with the gate structure, wherein the gate structure further overlaps the second gate oxide layer in the vertical direction.

10. The manufacturing method of the semiconductor device according to claim 9, wherein the step of forming the recess comprises:
   forming a pad oxide layer on the semiconductor substrate;
   forming a mask layer on the pad oxide layer, wherein the pad oxide layer and the mask layer are formed on the first region and the second region;
   removing a part of the pad oxide layer and a part of the mask layer for exposing a portion of the first region of the semiconductor substrate;
   performing an oxidation process to the exposed portion of the first region of the semiconductor substrate for forming an expanded oxide layer partially embedded in the semiconductor substrate and connected with the pad oxide layer; and
   removing the expanded oxide layer, the pad oxide layer, and the mask layer for forming the recess.

11. The manufacturing method of the semiconductor device according to claim 9, wherein the first gate oxide layer is partly formed in the recess and partly formed on the second region, and the step of forming the first gate oxide layer comprises:
   forming a patterned mask layer on the first gate oxide layer; and
   performing an etching process to the first gate oxide layer with the patterned mask layer as a mask for removing the first gate oxide layer formed on the second region and forming the hump portion of the first gate oxide layer, wherein the first gate oxide layer formed on the second region and a part of the first gate oxide layer formed above the recess are exposed after forming the patterned mask layer and during the etching process.

12. The manufacturing method of the semiconductor device according to claim 9, wherein the height of the hump portion is less than or equal to 15% of the depth of the recess.

13. The manufacturing method of the semiconductor device according to claim 9, wherein the first gate oxide layer further comprises:
   a main portion connected with the hump portion, wherein a top surface of the main portion is lower than a top surface of the hump portion in the vertical direction, a thickness of the main portion is greater than the height of the hump portion, a length of the hump portion in a horizontal direction is less than a length of the main portion in the horizontal direction, and the gate structure further overlaps the main portion in the vertical direction.

14. The manufacturing method of the semiconductor device according to claim 9, further comprising:
   forming a gate dielectric layer on the semiconductor substrate after removing the dummy gate structure and before forming the gate structure, wherein a portion of the gate dielectric layer is disposed between the gate structure and the first gate oxide layer in the vertical direction and another portion of the gate dielectric layer is disposed between the gate structure and the second gate oxide layer in the vertical direction.

15. The manufacturing method of the semiconductor device according to claim 9, further comprising:
   forming an opening penetrating through the first gate oxide layer in the vertical direction; and
   forming a drain region in the semiconductor substrate, wherein the drain region is formed corresponding to the opening in the vertical direction.

16. The manufacturing method of the semiconductor device according to claim 9, further comprising:
   forming a drift region in the semiconductor substrate, wherein the drift region is partly located under the first gate oxide layer in the vertical direction; and
   forming a drain region in the semiconductor substrate, wherein at least a part of the drain region is disposed in the drift region.

* * * * *